United States Patent
Yamamoto et al.

(10) Patent No.: US 7,091,800 B2
(45) Date of Patent: Aug. 15, 2006

(54) NOISE FILTER

(75) Inventors: Hidetoshi Yamamoto, Yokohama (JP);
Katsuyuki Uchida, Hikone (JP);
Kousuke Ishida, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/362,296

(22) PCT Filed: Jun. 12, 2002

(86) PCT No.: PCT/JP02/05864

§ 371 (c)(1),
(2), (4) Date: Jul. 14, 2003

(87) PCT Pub. No.: WO03/001665

PCT Pub. Date: Jan. 3, 2003

(65) Prior Publication Data

US 2004/0027770 A1    Feb. 12, 2004

(30) Foreign Application Priority Data

| Jun. 21, 2001 | (JP) | .............................. | 2001-188483 |
| May 13, 2002 | (JP) | .............................. | 2002-137197 |

(51) Int. Cl.
*H03H 7/00* (2006.01)

(52) U.S. Cl. ...................................... 333/185; 333/184
(58) Field of Classification Search ................ 333/184, 333/185, 181, 172, 132, 12, 232; 361/118; 341/184, 185; 330/185

See application file for complete search history.

(56) References Cited

U.S. PATENT DOCUMENTS

| 5,051,712 | A | * | 9/1991 | Naito et al. | ................ | 333/185 |
| 5,159,300 | A | * | 10/1992 | Nakamura et al. | .......... | 333/184 |
| 5,400,000 | A | * | 3/1995 | Okamura et al. | ........... | 333/175 |
| 5,412,357 | A | * | 5/1995 | Nakamura et al. | .......... | 333/181 |
| 5,495,213 | A | * | 2/1996 | Ikeda | ......................... | 333/181 |

(Continued)

FOREIGN PATENT DOCUMENTS

EP    0 566 145    10/1993

(Continued)

OTHER PUBLICATIONS

Notice of Submission of Argument issued by the Korean Patent Office, dated Dec. 17, 2004.

(Continued)

*Primary Examiner*—Linh Nguyen
(74) *Attorney, Agent, or Firm*—Keating & Bennett, LLP

(57) ABSTRACT

A noise filter in which the resonance of noise can be prevented, which is small in size and inexpensive, and is useful especially in an electronic device of which the signal frequency exceeds 100 MHz. In the noise filter, ground conductors are arranged on the outermost layers of a laminate formed by lamination of magnetic sheets and firing thereof. Transmission lines and ground conductors are alternately arranged with the magnetic sheets being sandwiched between them, respectively. Signal electrodes connected to the transmission lines and ground electrodes connected to the ground conductors are formed on the outer surface of the laminate. Thus, a signal is transmitted through the transmission lines while the ground conductors are grounded, and therefore, high frequency noise can be attenuated by utilization of heat loss caused by the magnetic sheets.

18 Claims, 19 Drawing Sheets

U.S. PATENT DOCUMENTS

| | | | | |
|---|---|---|---|---|
| 5,592,134 | A * | 1/1997 | Ogata et al. | 333/185 |
| 5,847,628 | A * | 12/1998 | Uchikoba et al. | 333/204 |
| 5,892,668 | A | 4/1999 | Okamoto et al. | |
| 6,115,234 | A * | 9/2000 | Ishii et al. | 361/303 |
| 6,133,809 | A * | 10/2000 | Tomohiro et al. | 333/185 |
| 6,166,613 | A * | 12/2000 | Nakagawa et al. | 333/205 |
| 6,437,665 | B1 * | 8/2002 | Kato | 333/185 |
| 6,577,208 | B1 * | 6/2003 | Kushitani et al. | 333/174 |
| 6,633,477 | B1 * | 10/2003 | Horie et al. | 361/119 |

FOREIGN PATENT DOCUMENTS

| | | |
|---|---|---|
| JP | 59-137622 | 9/1984 |
| JP | 1-24975 | 1/1989 |
| JP | 01-024975 | 7/1989 |
| JP | 01-024975 U | 7/1989 |
| JP | 4-78119 | 3/1992 |
| JP | 05-080010 | 3/1993 |
| JP | 05-080010 U | 3/1993 |
| JP | 5-299961 | 11/1993 |
| JP | 6-275436 | 9/1994 |
| JP | 07-045477 | 2/1995 |
| JP | 7-45477 | 2/1995 |
| JP | 7-263280 | 10/1995 |
| JP | 9-214273 | 8/1997 |
| JP | 10-154632 | 6/1998 |
| JP | 10-322156 | 12/1998 |
| JP | 11-186040 | 7/1999 |
| JP | 11-214256 | 8/1999 |
| JP | 11-251857 | 9/1999 |
| JP | 2000-124068 | 4/2000 |
| JP | 2000-348944 | 12/2000 |
| JP | 2000-353619 | 12/2000 |
| JP | 2000-357632 | 12/2000 |
| JP | 2001-111302 | 4/2001 |
| JP | 2001-160510 | 6/2001 |

OTHER PUBLICATIONS

Official Communication dated Oct. 4, 2005, issued in the corresponding Japanese Patent Application No. 2002-180356.

Official Communication dispatched on Oct. 4, 2005 and issued in the corresponding Japanese Application No. 2002-180356 filed on Jun. 20, 2002.

Notice of Submission of Argument issued by the Korean Patent Office, dated Dec. 17, 2004.

* cited by examiner

NOISE FILTER

This application is a 371 of PCT/JP02/05864 filed on Jun. 12, 2002.

BACKGROUND OF THE INVENTION

1. Field of the Invention

The present invention relates to a noise filter which is suitable for use in suppression of electromagnetic noise interferences in electronic devices.

2. Description of the Related Art

In general, various types of noise filters are used in suppression of electromagnetic noise interferences in electronic devices. In a known related art noise filter, for example, a circuit using a lumped constant such as a three-terminal capacitor is formed (see for example, Japanese Unexamined Patent Application Publication No. 10-154632 ). In such a noise filter of the related art, noise is suppressed using a reflection loss in which the reflection coefficient is increased at the frequency of noise to be generated.

Moreover, in a known noise filter according to another related art, a circuit including many inductors and capacitors is formed (see for example, Japanese Unexamined Patent Application Publication No. 2000-34894 ).

According to the above-mentioned related art techniques, noise is suppressed by use of the reflection loss. In the case where a noise filter is disposed, e.g., in a line connecting circuits to each other, problems are caused in that probably, noise having a specific frequency resonates between the noise filter and a circuit in the periphery thereof, and the resonance causes amplification of the noise.

Especially, in recent years, signal frequencies to be adapted for digital devices tend to become higher, and the number of electronic devices of which the signal frequencies exceed 100 MHz has been increased. Therefore, low-pass filters of which the cut-off frequencies exceed 200 MHz have been demanded. On the other hand, for example, the lengths of lines between a noise filter and parts disposed in the periphery thereof and the lengths of lines between plural parts are such that resonance with a signal (noise) with a high frequency of 200 MHz or higher may occur easily. Accordingly, for electronic parts of which the signal frequencies exceed 100 MHz, noise filters using reflection loss as carried out in the related art ones are difficult to be used.

Moreover, according to the other related art, resonance phenomena are suppressed by reduction of the reflection loss. However, in the noise filter of the other related art, many inductors and capacitors are connected to form a circuit. The structure is complicated, the size can be reduced with much difficulty, and the manufacturing cost is high. Moreover, problematically, the noise filter is difficult to be fixed to a printed wiring, since the filter has no chip-shape.

In view of the above-described problems of the related art, the present invention has been devised. An object of the present invention is to prevent noise from resonating and provide a noise filter which is small in size and inexpensive.

DISCLOSURE OF INVENTION

To solve the above-described problems, in a noise filter according to claim 1 of the present invention, the filter contains two magnetic sheets overlapping each other, a transmission line is disposed between the two magnetic sheets, and the two magnetic sheets are sandwiched by and between two sheets of ground conductors from the upper and lower sides.

According to this constitution, regarding the magnetic material forming the magnetic sheets, the heat loss is increased with the frequency of a signal transmitted through the transmission lines becoming higher. Thus, noise can be suppressed by utilization of the heat loss.

The characteristic impedance of the noise filter can be set by appropriately setting of the width of the transmission lines and the thickness of the magnetic sheets. Especially, the relative permeability of the magnetic material becomes substantially constant irrespective of the frequency of a signal. Thus, the characteristic impedance can be kept at a substantially constant value irrespective of the frequency of the signal. Therefore, impedance matching for circuits connected to the noise filter can be attained substantially all over the frequency ranges. Thus, the reflection loss of the noise filter can be reduced.

Moreover, each of the transmission lines is sandwiched between two ground conductors. Thus, the transmission line positioned between two magnetic sheets can be covered over the whole length thereof with the ground conductors. Thus, no reflection of noise occurs on the way of the transmission line, and resonance of noise can be suppressed. Moreover, a signal being transmitted through the transmission line can be confined between the two ground conductor. Attenuation of the signal in the pass-band can be prevented, and also, incorporation of external noise in the transmission line can be prevented. Thus, a signal can be securely transmitted.

According to claim 2 of the invention, the filter contains plural magnetic sheets overlapping each other, transmission lines and ground conductors are alternately overlapped and interposed between the respective magnetic sheets, with the uppermost layer and the lowermost layer of the magnetic sheets having ground conductors arranged thereon, and the plural layer transmission lines are connected in series with each other by means of passing-through lines passing through the respective magnetic sheets.

Thereby, when a signal with a high frequency is transmitted through the transmission line, noise can be suppressed by utilization of increasing of the heat loss of the magnetic sheets. The characteristic impedance of the noise filter can be set by appropriately setting of the width of the transmission line and the thickness of the magnetic sheets. Especially, the relative permeability of the magnetic material becomes substantially constant irrespective of the frequency of a signal. Thus, the characteristic impedance can be kept at a substantially constant value irrespective of the frequency of the signal. Therefore, impedance matching for circuits connected to the noise filter can be attained substantially all over the frequency ranges. Thus, the reflection loss of the noise filter can be reduced.

Moreover, the transmission lines and ground conductors are alternately overlapped and interposed between the respective magnetic sheets, with the uppermost layer and the lowermost layer of the magnetic sheets having ground conductors arranged thereon. Therefore, a signal being transmitted through the transmission line can be confined between the ground conductors, and the attenuation of the signal in the pass-band can be prevented.

The ground conductors are arranged on the uppermost layer and the lowermost layer of the plural magnetic sheets overlapping each other. Thus, incorporation of external noise into the transmission line can be prevented. The signal can be securely transmitted.

In the case where the widths of all the transmission lines are set at substantially the same value, and also, the thicknesses of all the magnetic sheets are set at substantially the same value, the characteristic impedances of the transmission lines of the respective layers can be substantially equal to each other. Thus, since the characteristic impedance of the whole of the transmission lines connected in series with each other, no reflection of noise occurs on the way of the transmission line, and the noise can be prevented from resonating. The impedance matching to an external circuit can be easily attained.

Furthermore, the plural layer transmission lines are connected in series with each other by means of passing-through lines passing through the respective magnetic sheets. Accordingly, the overall length of the transmission lines can be increased, and the attenuation of noise being transmitted through the transmission line can be increased.

According to claim 3 of the present invention, the transmission lines each have a substantially arc or U-character shape having a turning-around point, and are formed so that the transmission lines, as a whole, have a coil shape in the thickness direction.

Thereby, although the thickness of the noise filter is increased to some degree, the bottom area of the noise filter can be set to be substantially equal to the opening area of the coil. Therefore, the noise filter can be arranged even in a narrow mounting-space.

According to claim 4 of the present invention, the transmission lines have a meandering-zigzag shape. Thereby, the lengths of the transmission lines can be increased compared to the straight-line shaped transmission lines, and the attenuation of noise can be increased.

According to claim 5 of the present invention, the magnetic sheets are formed with a ceramic material having a magnetic property. Thereby, the noise filter can be formed by firing the magnetic sheets while they overlap each other.

According to claim 6 of the present invention, the magnetic sheets are formed with a resin material containing magnetic powder. Thus, the noise filter can be formed by bonding the magnetic sheets to each other with an adhesive. Thus, production processes such as firing and the like can be omitted. The production efficiency can be enhanced.

According to claim 7 of the present invention, the magnetic sheets are formed in a quadrangular shape, signal electrodes are formed on both the end-sides in the longitudinal direction of the magnetic sheets so as to be connected to both the ends of the transmission lines, and ground electrodes Are formed in the middle positions in the longitudinal direction of magnetic sheets so as to be connected to the ground conductors.

Thus, a wiring between two circuits is extended in a straight-line shape. Thus, the signal electrodes positioned on both the end side in the longitudinal direction of the magnetic sheets can be easily connected to the wiring on the way thereof. Moreover, the ground electrodes provided on the intermediate positions in the longitudinal direction of the magnetic sheets can be easily connected to ground terminals provided in the periphery of the wiring. Thus, the mounting-property of the noise filter can be enhanced.

According to claim 8 of the present invention, the filter contains plural magnetic sheets overlapping each other, transmission lines and ground conductors are alternately overlapped and interposed between the respective magnetic sheets, with the uppermost layer and the lowermost layer of the magnetic sheets having ground conductors arranged thereon, and one-end sides of the plural layer transmission lines are connected to signal input electrodes different from each other, and the other-end sides of the plural layer transmission lines are connected to signal output electrodes different from each other.

Thus, the plural layer transmission lines are connected to the signal input electrodes different from each other, and also the different signal output electrodes. The plural layer transmission lines can be individually operated as low pass filters. As a whole, a noise filter array can be formed. When a signal with a high frequency is transmitted through the transmission lines of the respective layers, noise can be suppressed by utilization of increasing of the heat loss of the magnetic sheets. The characteristic impedance of the noise filter can be set by appropriately setting of the widths of the transmission lines and the thicknesses of the magnetic sheets. Especially, the relative permeability of the magnetic material has a substantially constant value irrespective of the frequency of a signal. Thus, the impedance matching with a circuit connected to the noise filter can be attained substantially over the whole frequency range, and the reflection loss of the noise filter can be reduced.

Moreover, the plural layer transmission lines are operated as independent low-pass filters. Thus, no impedance mismatching occurs on the way of the transmission line, e.g., in contrast to the case where the plural layer transmission lines are connected to each other by means of the passing-through lines passing through the magnetic sheets, the impedance mismatching is easily caused in the vicinities of the passing-through lines containing discontinuous points. Therefore, no reflection of noise is caused on the way of the transmission line, so that the resonance of noise can be suppressed, and the impedance matching to an external circuit can be easily attained.

Moreover, the transmission lines and the ground conductors are alternately overlapped and interposed between the respective magnetic sheets, with the uppermost layer and the lowermost layer of the magnetic sheets having ground conductors arranged thereon. The transmission line of each layer can be arranged between the two magnetic sheets, and also, the transmission line of each layer can be covered over the whole length thereof with the two ground conductors. Therefore, a signal transmitted through the transmission line of each layer can be confined between the ground conductors, and the attenuation of the signal in the pass-band can be prevented.

The uppermost layer and the lowermost layer of the plural magnetic sheets overlapping each other have the ground conductors disposed thereon. Thus, incorporation of external noise into the transmission lines of the respective layers can be prevented. A signal can be securely transmitted.

According to claim 9 of the present invention, the transmission lines are formed in a meandering-zigzag shape, respectively. According to claim 10 of the present invention, the transmission lines are formed in a spiral pattern, respectively. Thereby, the lengths can be increased compared to those of the transmission lines formed in a straight-line pattern, respectively. Thus, the attenuation of noise can be increased.

According to claim 11 of the present invention, the cut-off frequency is in the range of from 200 MHz to 2 GHz, the relative permeability μr of each magnetic sheet is within the range of $4 \leq \mu r \leq 30$, and the length L [mm] of each transmission line is set so as to satisfy $L/\sqrt{(\mu r-1)} \geq 3$ mm. The relative permeability μr represents the ratio of the permeability μ [H/m] of a magnetic sheet to that $\mu_0$ [H/m] of vacuum, and has a value defined by the following numerical formula 1.

$$\mu_r = \frac{\mu}{\mu_0} \qquad \text{[Numerical Formula 1]}$$

As described above, the cut-off frequency range can be easily set to be within 200 MHz≦fc≦2 GHz by setting the relative permeability μr of the magnetic sheet to be 4≦μr≦30, and setting the length of the transmission line so as to satisfy L/√(μr−1)≧3 mm. Moreover, the slope of a noise attenuation curve (the ratio of the attenuation change of a signal with respect to the frequency of the signal) tends to increase in proportion to the length L of a transmission line and also to increase in reverse proportion to √(μr−1) based on the relative permeability μr of the magnetic sheet. Therefore, the slope of the relative permeability μr of the magnetic sheet can be set to be at least 20 dB/dec. by setting the relative magnetic sheet μr to be in the range of 4≦μr≦30, and setting to be √(μr−1)≧3 mm. Thus, the difference between a signal and noise can be increased.

According to claim 12 of the present invention, the thickness of each ground conductor is smaller than that of each transmission line.

Accordingly, the overall thickness of the noise filter can be reduced, and the size can be decreased. Moreover, the thickness of the transmission line can be set to be larger than that of the ground conductor. Thus, the DC resistance of the transmission line can be reduced, and larger current can be flown.

BEST MODE FOR CARRYING OUT THE INVENTION

Figure 1:
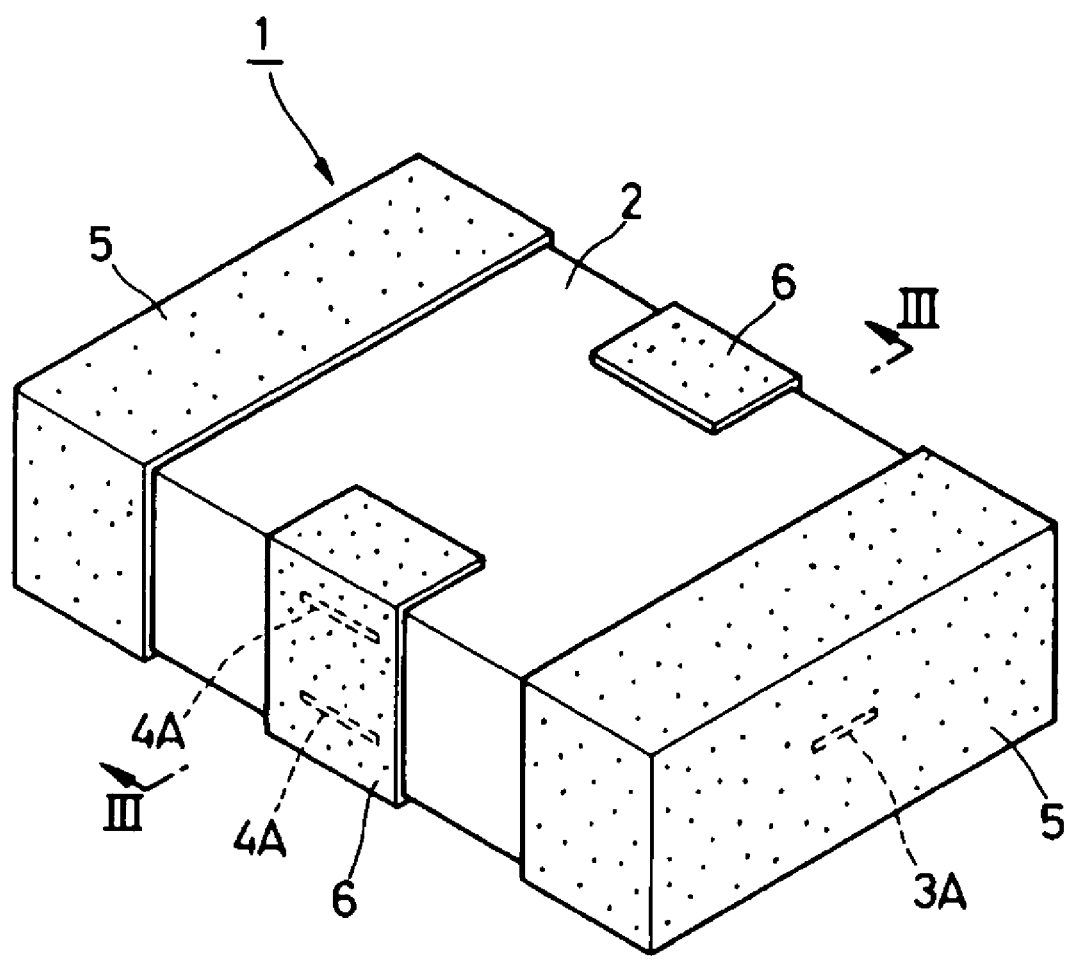
FIG. 1 is a perspective view of a noise filter according to a first embodiment.
Figure 2:
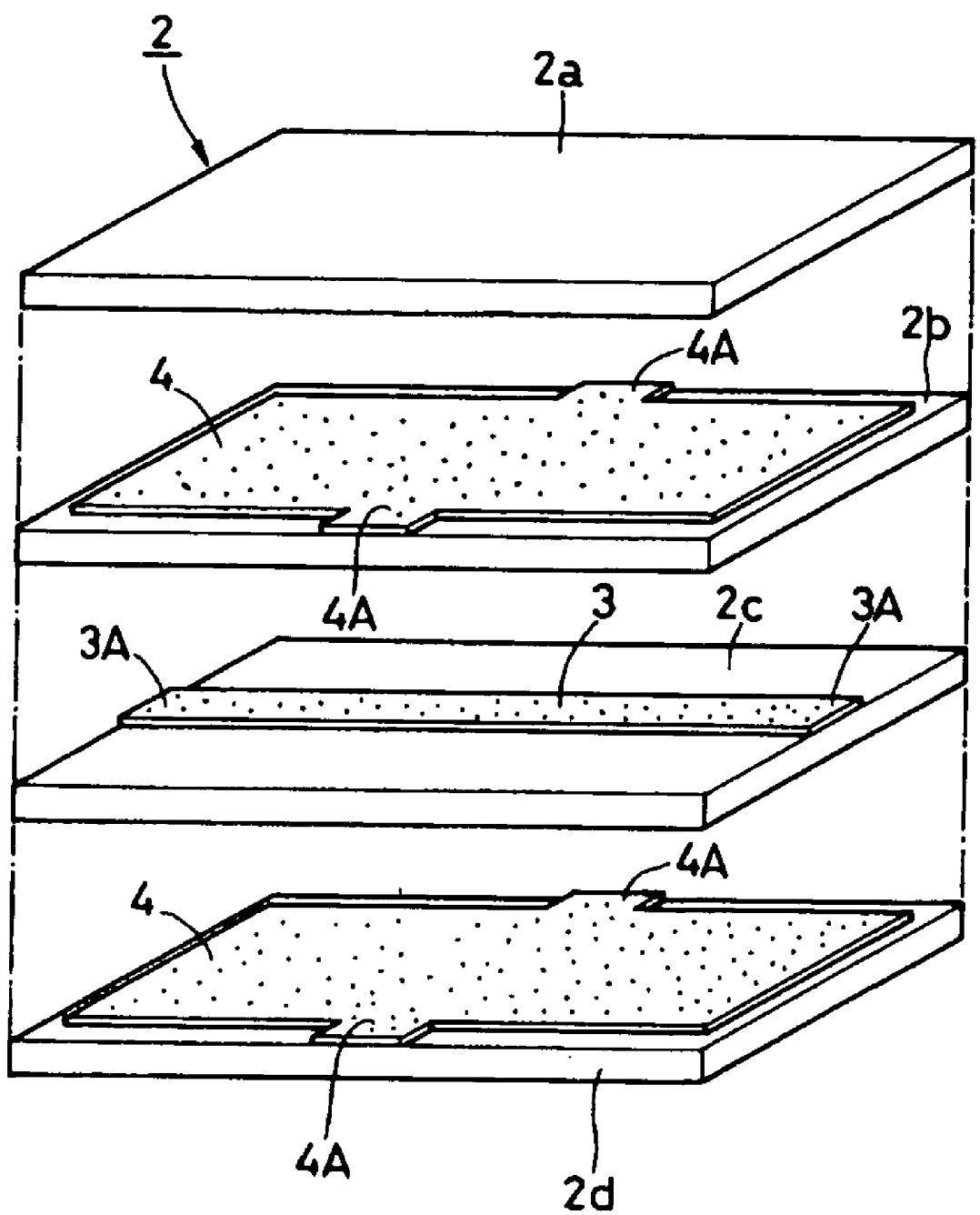
FIG. 2 is an exploded perspective view of the noise filter according to the fist embodiment of the present invention.
Figure 3:
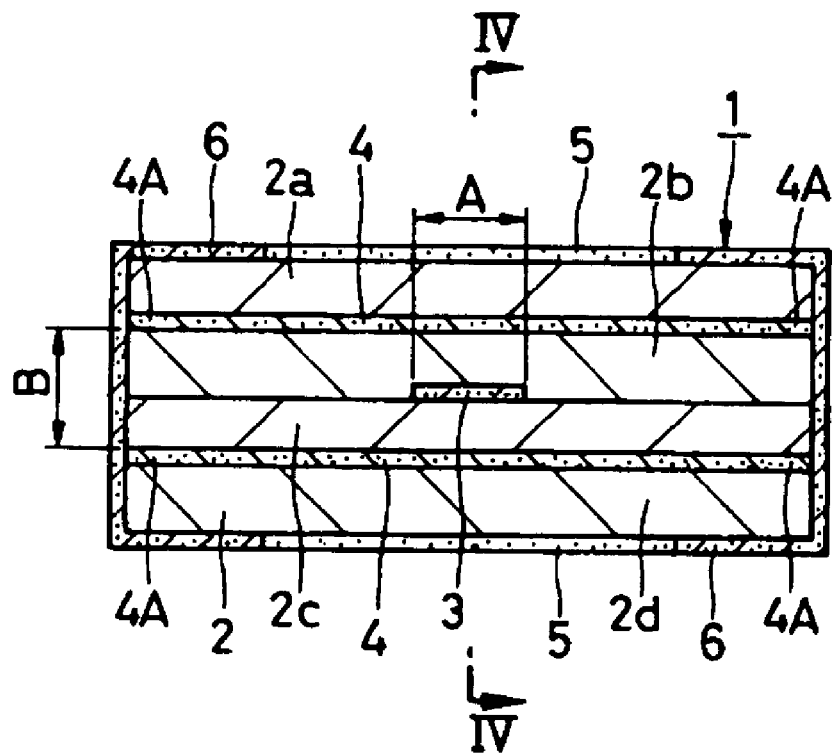
FIG. 3 is a cross-sectional view of the noise filter taken in the direction indicated by arrow III—III of FIG. 1.
Figure 4:
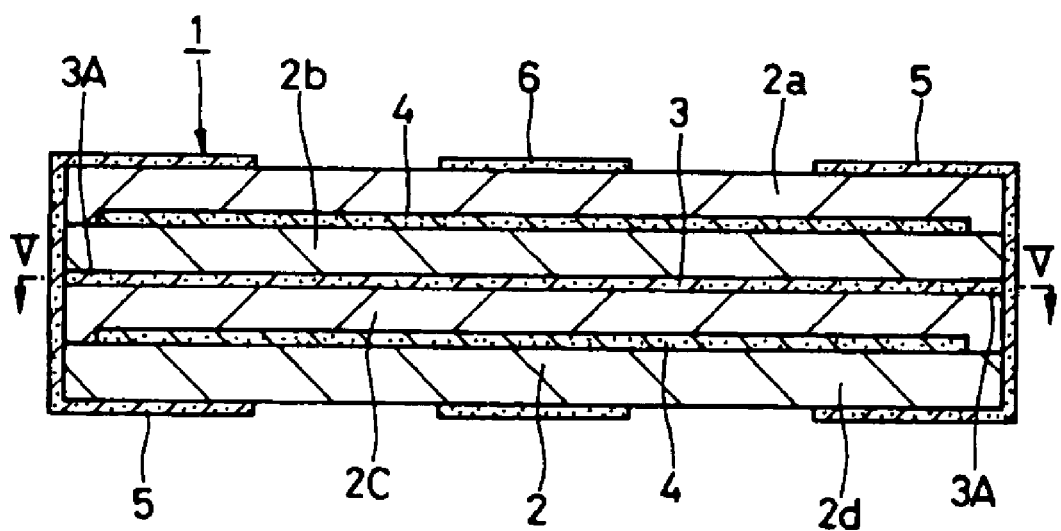
FIG. 4 is a cross-sectional view of the noise filter taken in the direction indicated by arrow IV—IV of FIG. 3.
Figure 5:
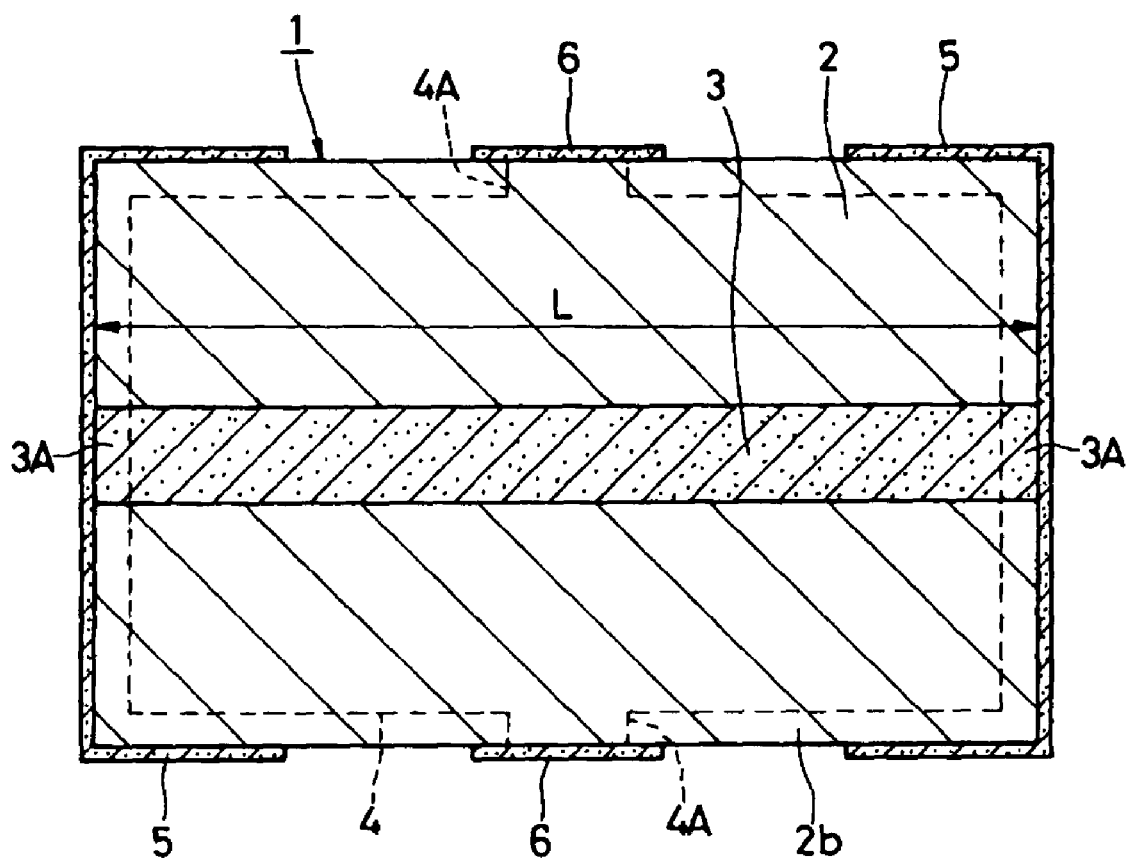
FIG. 5 is a cross-sectional view of the noise filter taken in the direction of arrow V—V of FIG. 4.

Embodiments of the noise filter according to the present invention will be described with reference to FIGS. 1 to 24 in detail.

FIGS. 1 to 5 deal with the first embodiment. Reference numeral 1 designates a noise filter according to this embodiment. The noise filter 1 comprises magnetic sheets 2a to 2d which will be described later, a transmission line 3, ground conductors 4, signal electrodes 5, and a ground electrode 6. Moreover, the cut-off frequency fc of the noise filter 1 is set at a value e.g., within the range of 200 MHz to 2 GHz (200 MHz≦fc≦2 GHz).

A laminate 2 has a substantially rectangular column shape which constitutes the outline of the noise filter 1. The laminate 2 is formed by pressing of, e.g., four magnetic sheets 2a to 2d laid on each other and then firing these magnetic sheets 2a to 2d. Moreover, the magnetic sheets 2a to 2d are formed in a quadrangular sheet shape, respectively, and are made of a ceramic material having a magnetic characteristic such as ferrite or the like. The relative permeability of the magnetic sheets 2b and 2c sandwiched by the two ground conductors 4 which will be described below is set at e.g., a value within the range of about 4 to 30 (4≦μr≦30).

The material for the magnetic sheets 2a and 2d may be different from that for the magnetic sheets 2b and 2d. However, to reduce the manufacturing cost, it is preferred to use the same material for all the four magnetic sheets 2a to 2d.

The transmission line 3 is disposed between the magnetic sheets 2b and 2c. The transmission line 3 is formed substantially in a belt-shape, using an electroconductive metallic material such as silver paste, palladium, or the like. The transmission line 3 is positioned in the center between the magnetic sheets 2b and 2c in the short-side direction thereof and is extended in a straight line shape in the longitudinal direction. Moreover, the transmission line 3 is positioned substantially in the center between the two ground conductors 3 which will be described below. Both the ends of the transmission line 3 constitute electrode portions 3A, which are connected to the signal electrodes 5, respectively.

The characteristic impedance W of the transmission line 3 has a value expressed by the following numerical formula 2, in which A is the width of the transmission line 3, B is the distance between the two ground conductors 4, $\mu$ is the magnetic permeability of the laminate 2 (magnetic sheets 2b and 2c), and $\epsilon$ is the dielectric constant of the laminate 2.

$$W = \frac{1}{4}\sqrt{\frac{\mu}{\varepsilon}}\frac{B}{A} \qquad \text{[Numerical Formula 2]}$$

Moreover, for example, the length L of the transmission line is set at a value which, together with the relative permeability $\mu r$ of the magnetic sheets 2b and 2c, satisfies the following numerical formula 3.

$$\frac{L}{\sqrt{\mu_r - 1}} \geq 3\,\text{mm} \qquad \text{[Numerical Formula 3]}$$

In the case where the noise filter 1 is formed with a small chip part, the length L of the transmission line 3 is required to be up to 100 mm. On the other hand, the relative permeability $\mu r$ of the magnetic sheets 2b and 2c is set so as to satisfy $4 \leq \mu r \leq 30$. Therefore, the value of $L/\sqrt{(\mu r-1)}$ is preferably in the range of from 3 mm to 20 mm as shown by the following numerical formula 4.

$$3\,\text{mm} \leq \frac{L}{\sqrt{\mu_r - 1}} \leq 20\,\text{mm} \qquad \text{[Numerical Formula 4]}$$

The ground conductors 4 are provided on the front side of the magnetic sheet 2b and on the back side of the magnetic sheet 2c, respectively. Thus, the ground conductors 4 sandwich the two magnetic sheets 2b and 2c, which are disposed in the middle position in the thickness direction of the noise filter 1, from the upper and lower sides thereof, respectively. Moreover, the ground conductors 4 are formed into a substantially quadrangular flat-sheet shape with an electroconductive metallic material such as silver paste, palladium or the like, and cover substantially all the surfaces of the magnetic sheets 2b and 2c, respectively. Moreover, electrode portions 4A are provided in the middle portions of the ground conductors 4 in the longitudinal direction (the right-left side direction in FIG. 2) of the substantially quadrangular magnetic sheets 2b and 2c, respectively. The electrode portions 4A are extended in the width direction (the front-back side direction in FIG. 2) toward both the side-edges so as to have a tongue shape, respectively. The electrode portions 4A are connected to the below-described ground electrodes 6, respectively. The ground conductors 4 are covered with the magnetic sheets 2a and 2d, respectively.

The signal electrodes 5 are provided on both the ends in the longitudinal direction of the laminate 2 (magnetic sheets 2a to 2d). The signal electrodes 5 cover the end-faces of the laminate 2 and also cover the front-face, the back-face, and the side-faces so as to form cylinders, respectively. Regarding the signal electrodes 5, for example, an electroconductive metallic material is coated onto both the ends of the laminate 2, and thereafter, the electroconductive metallic material is baked so that the signal electrodes 5 are fixed. The signal electrodes 5 are connected to the electrode portions 3A of the transmission line 3, respectively.

The ground electrodes 6 are provided on both the end-sides in the width direction of the laminate 2 and in the middle portions in the longitudinal direction of the laminate 2, respectively. Each ground electrode 6 has a substantially U-character shape and is extended on the side faces of the laminate 2 in the thickness direction, and a part of each ground electrode 6 is extended onto the front and back faces of the laminate 2 so as to form a substantially U-character shape. For example, the ground electrode 6 is formed by coating an electroconductive metallic material onto the side-face sides of the laminate 2 and baking it. The ground electrodes 6 are connected to the electrode portions 4A of the ground conductors 4, respectively.

The noise filter 1 of this embodiment is formed as described above. The operation will be described below.

First, the noise filter 1 is disposed on a substrate having a wiring through which a signal is transmitted. The signal electrodes 5 are connected to the wiring on the way thereof, respectively, and the ground electrodes 6 are connected to ground terminals, respectively. Thereby, a signal can be transmitted through the transmission line 3, and the ground conductors 4 have the ground potential.

Referring to the magnetic material such as ferrite or the like constituting the magnetic sheets 2a to 2d, as the frequency of a signal which is transmitted through the transmission line 3 is increased, the heat loss of the signal tends to be increased. Therefore, a low-pass filter can be formed by utilization of the heat loss. Accordingly, a signal having a frequency (100 MHz to 1 GHz) lower than the cut-off frequency fc which is set e.g., at about 200 MHz to 2 GHz can be transmitted through the transmission line 3. A signal with a higher frequency than the above-mentioned frequency can be attenuated as noise to be suppressed.

Moreover, the characteristic impedance W of the noise filter 1 can be set by appropriating setting the width A of the transmission line 3 and the thickness of the magnetic sheets 2b and 2c (distance B between the ground conductors 4). Moreover, the dielectric constant $\mu r$ of the magnetic material is substantially constant irrespective of the frequency of a signal. Thus, the characteristic impedance W can be kept at a substantially constant value irrespective of the frequency of the signal. Accordingly, regarding circuits connected to the noise filter 1, the impedance matching can be attained substantially in the overall frequency range, the reflection loss of the noise filter 1 can be reduced, and the noise, which may be caused by the resonance, can be suppressed from increasing.

Moreover, due to the configuration in which the transmission line 3 positioned between the magnetic sheets 2b and 2c can be covered with the two ground conductors 4 over all the length of the line 3, the noise is prevented from reflecting on the way of the transmission line 3, and the noise can be suppressed from resonating. Moreover, the signal, which is being transmitted through the transmission line 3, can be confined between the ground conductors 4. Thus, the attenuation of the signal in the pass-band can be prevented, and incorporation of external noise into the transmission line 3 can be prevented. Thus, the signal can be securely transmitted.

The cut-off frequency fc of the noise filter 1 can be appropriately set by adjustment of the composition (the relative permeability $\mu r$ of the magnetic sheets 2b and 2c) of the magnetic material for the magnetic sheets 2a to 2d and the length L of the transmission line 3.

The relations of the cut-off frequency fc to the relative permeability μr of the magnetic sheets 2b and 2c and the length L of the transmission line 3 will be described with reference to FIGS. 6 to 11.

First, the relative permeability μr of the magnetic sheets 2b and 2c is set at a constant value, e.g., at 10 (μr=10), and the lengths L of the transmission lines 3 were set at 5 mm, 10 mm, and 50 mm, respectively. Then, the noise filter 1 was simulated.

Figure 6:
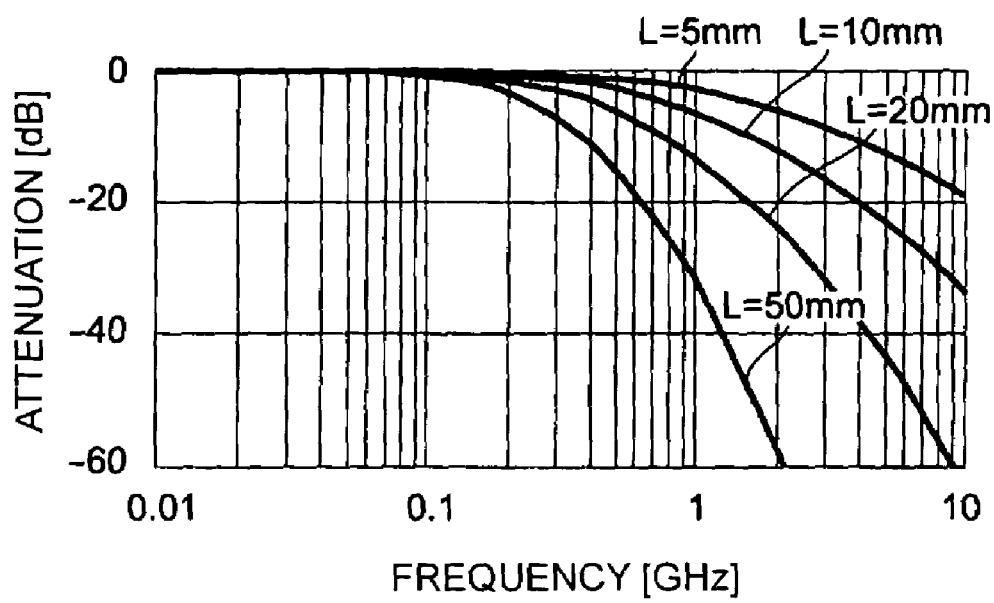
FIG. 6 is a characteristic diagram showing the correlation between the frequency of a signal and the attenuation obtained when the relative permeability μr of a magnetic sheet is set at 10.

As a result, as shown in FIG. 6, four attenuation curves were obtained correspondingly to the lengths L of the four-type transmission lines 3.

As seen in the results of FIG. 6, the longer the length L of the transmission line 3 becomes, the more the cut-off frequency fc (the frequency at which the attenuation is −3 dB) decreases, and also, for example, the slope (the ratio of the change of the attenuation to that of the frequency) of the attenuation curve increases at the attenuation of about −10 dB.

Moreover, the lengths L of the transmission lines 3 set at a constant value, e.g., at 50 mm (L=50 mm), and the relative permeabilities μr of the magnetic sheets 2b and 2c were set at 3, 5, 10, 20, and 30, respectively. Thus, the noise filter 1 was simulated. As a result, as seen in FIG. 7, five attenuation curves were obtained.

Figure 7:
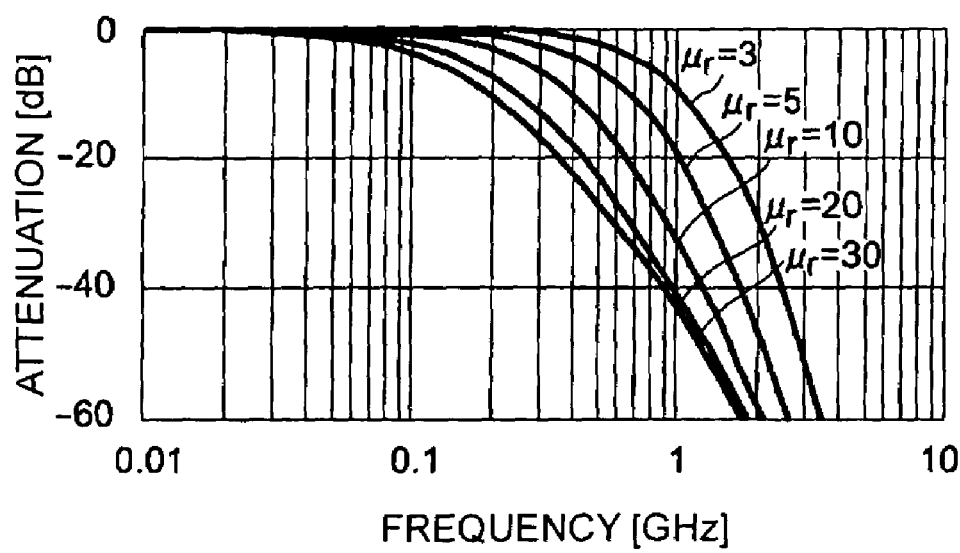
FIG. 7 is a characteristic diagram showing the correlation between the frequency of a signal and the attenuation obtained when the length L of a transmission line is set at 50 mm.

As seen in the results of FIG. 7, the larger the relative permeability μr becomes, the lower the cut-off frequency fc becomes, and however, the slope of the attenuation curve is reduced, e.g., at an attenuation of −10 dB.

The inventors of this invention have intensively investigated these characteristics. As a result, it has been found that when the constants C [mm] determined according to the following numerical formula 5 based on the lengths L of the transmission lines 3 and the relative permeabilities μr of the magnetic sheets 2b and 2c are equal, the shapes (slopes) of the attenuation curves are substantially the same, even if the lengths L and also the relative permeabilities μr are different from each other, respectively.

$$C = \frac{L}{\sqrt{\mu_r - 1}}$$ [Numerical Formula 5]

Figure 8:
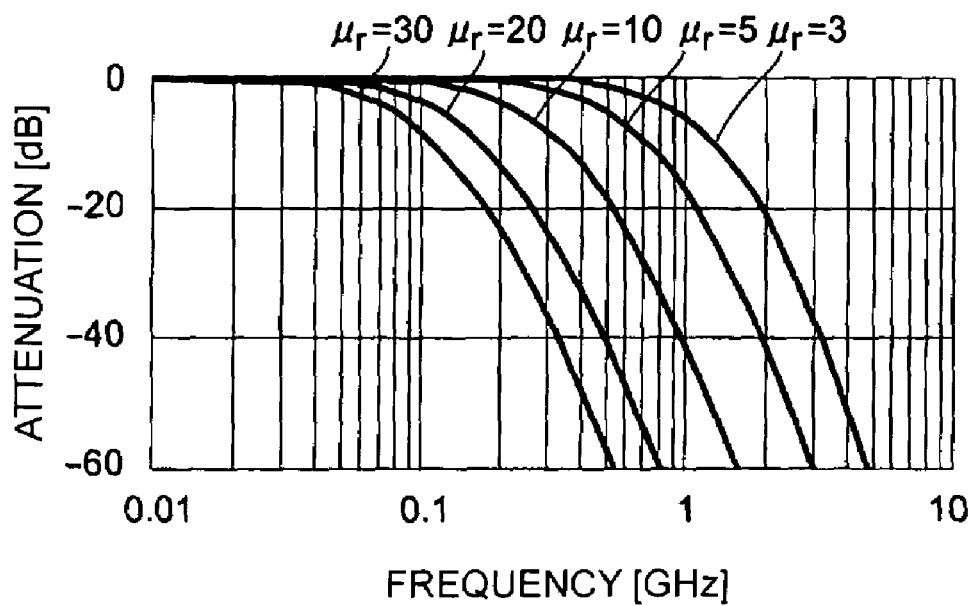
FIG. 8 is a characteristic diagram showing the correlation between the frequency of a signal and the attenuation obtained when the constant C is set at 20 mm.

For example, the constant C was set at a constant value, e.g., at 20 mm (C=20 mm), the relative permeabilities μr of the magnetic sheets 2b and 2c were set at 3, 5, 10, 20, and 30, and the lengths L of the transmission line 3 were set at 35 mm, 45 mm, 63 mm, 89 mm, and 109 mm, respectively, and the simulation was carried out. FIG. 8 shows the obtained attenuation curves.

Figure 9:
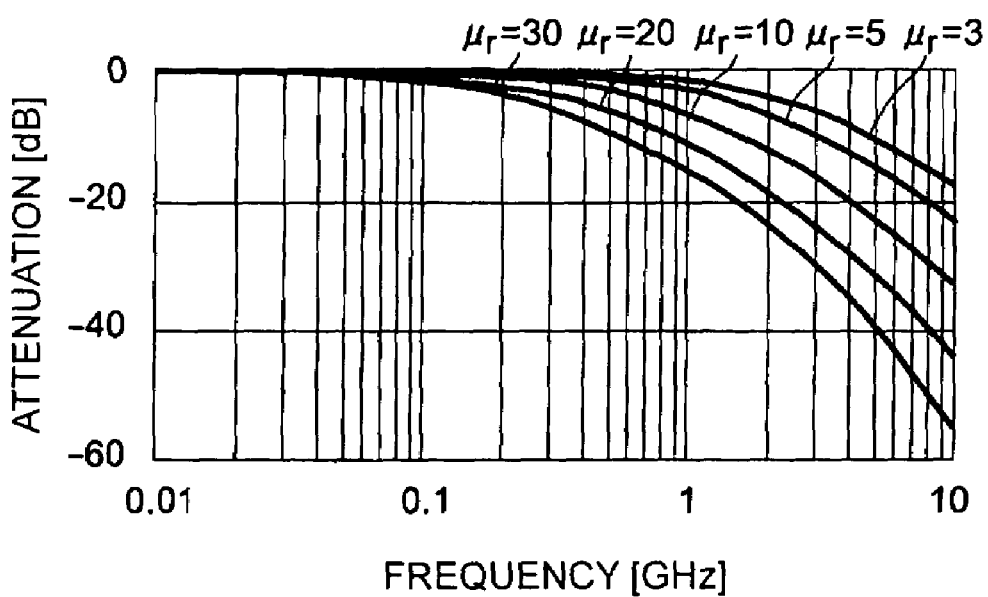
FIG. 9 is a characteristic diagram showing the correlation between the frequency of a signal and the attenuation obtained when the constant C is set at 3 mm.

Moreover, the constant C was set at a constant value, e.g., at 3 mm (C=3 mm), the relative permeabilities μr of the magnetic sheets 2b and 2c were set at 3, 5, 10, 20, and 30, and the lengths L of the transmission line 3 were set at 5.19 mm, 6.72 mm, 9.48 mm, 13.4 mm, and 16.4 mm, respectively, and the simulation was carried out. FIG. 9 shows the obtained attenuation curves.

Thus, when the constants C are equal, the cut-off frequency fc is reduced with increasing of the relative permeability μr. However, even when the lengths L and also the relative permeabilities μr are different from each other, respectively, the shapes (slopes) of the attenuation curves are substantially the same. Furthermore, the slope of the attenuation becomes larger with increasing of the constant C.

Figure 10:
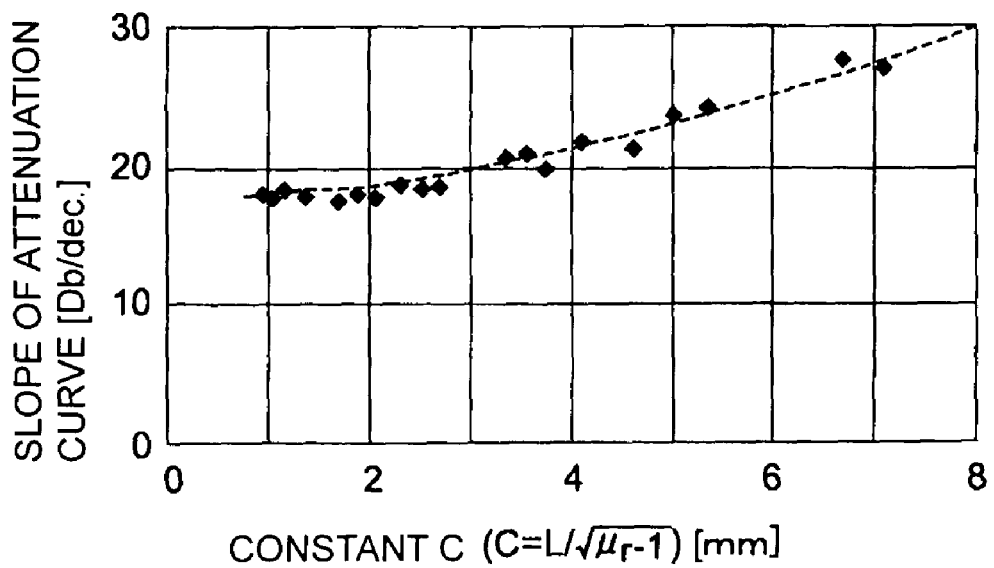
FIG. 10 is a characteristic diagram showing the correlation between the constant C and the inclination of an attenuation curve.

Moreover, investigation has been made on the relationship between the constants C and the slopes of the attenuation curves at an attenuation of about −10 dB. Thus, the results shown in FIG. 10 were obtained. The slope of the attenuation curve of a bypass capacitor, which is generally used for noise countermeasures, is 20 dB/dec. Preferably, the bypass filter has a slope larger than 20 dB/dec. for use as a noise-countermeasures part. As seen in the results of FIG. 10, when the constant C is larger than 3 mm, the slope of the attenuation is at least 20 dB/dec. Thus, the filter is significantly effective as a part for noise-countermeasures.

Figure 11:
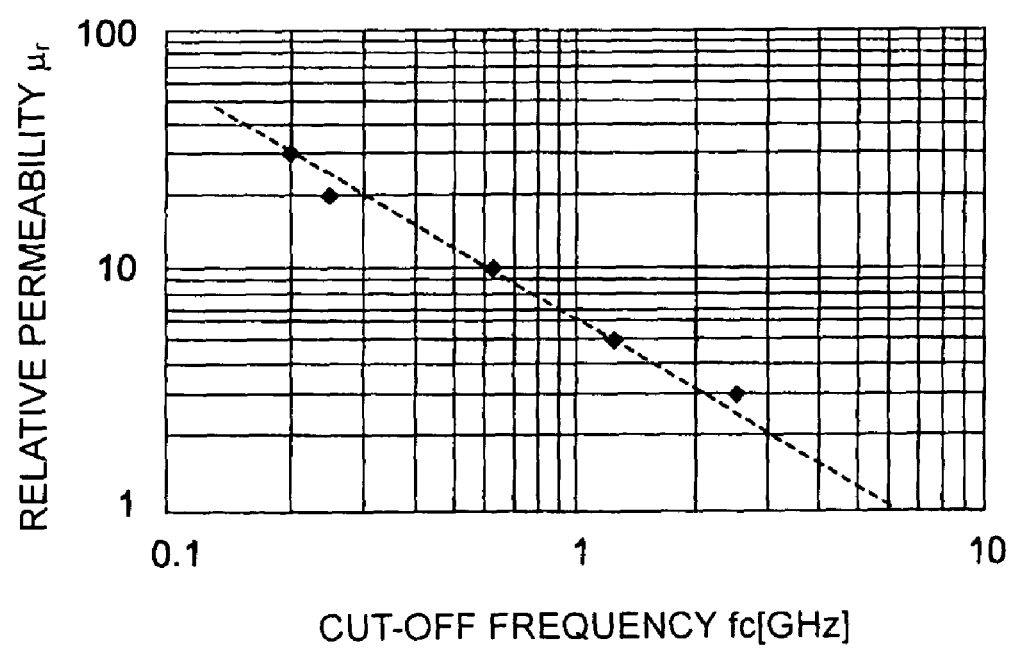
FIG. 11 is a characteristic diagram showing the correlation between the cut-off frequency fc and the relative permeability μr of a magnetic sheet.
Figure 12:
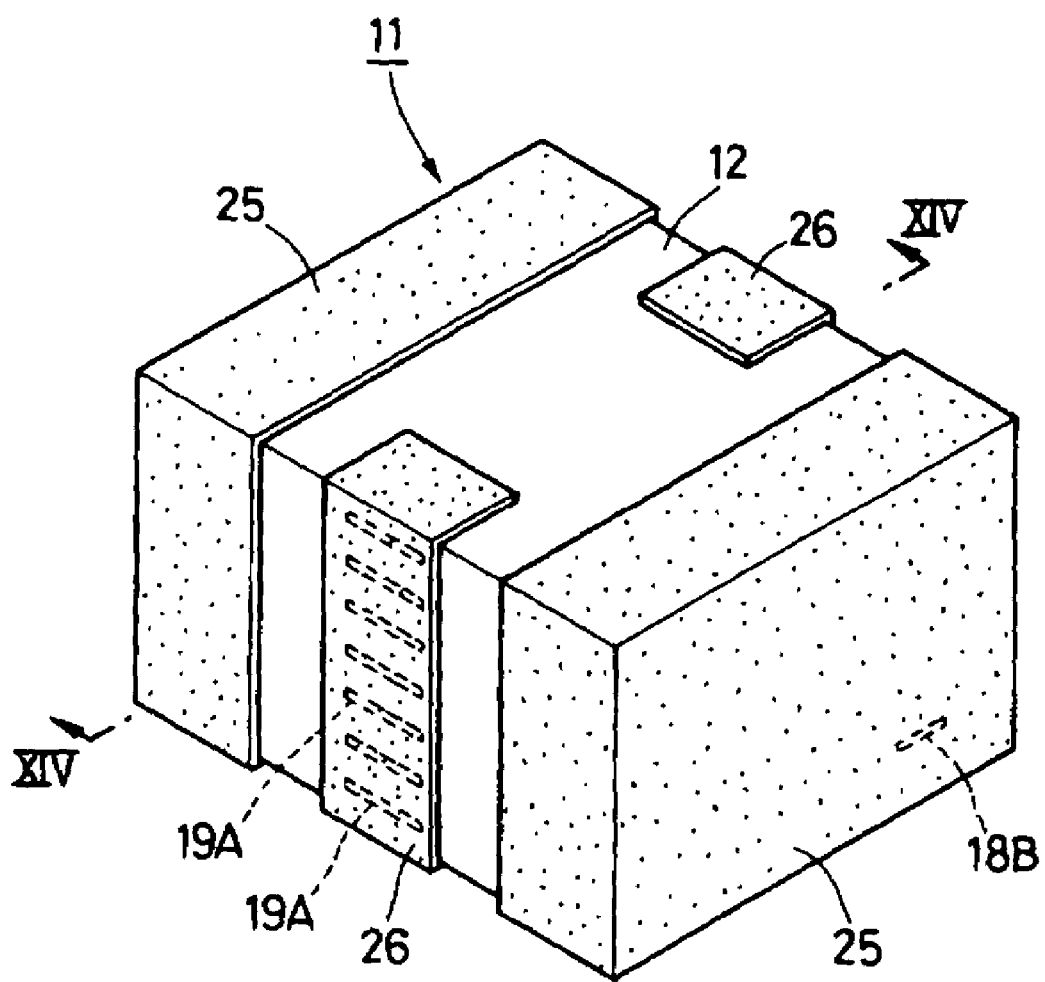
FIG. 12 is a perspective view of a noise filter according to a second embodiment.
Figure 13:
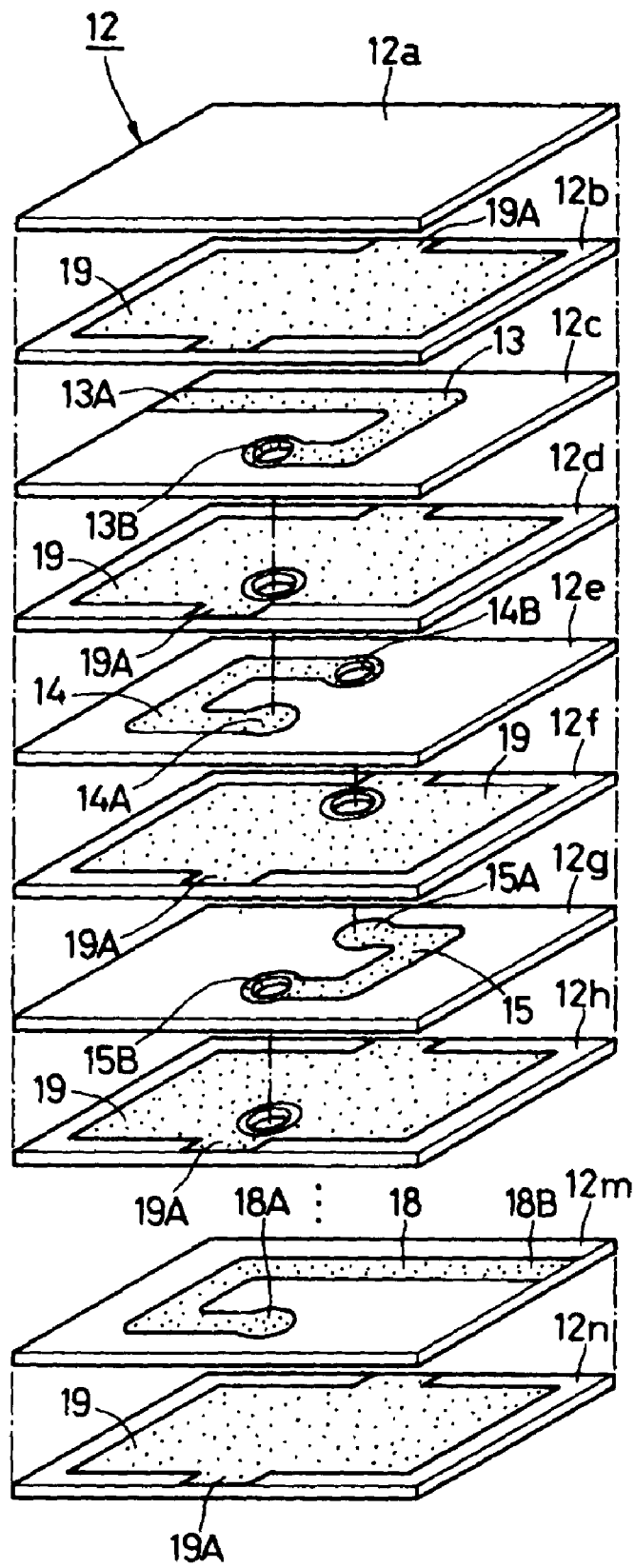
FIG. 13 is an exploded perspective view of the exploded noise filter according to the second embodiment.
Figure 14:
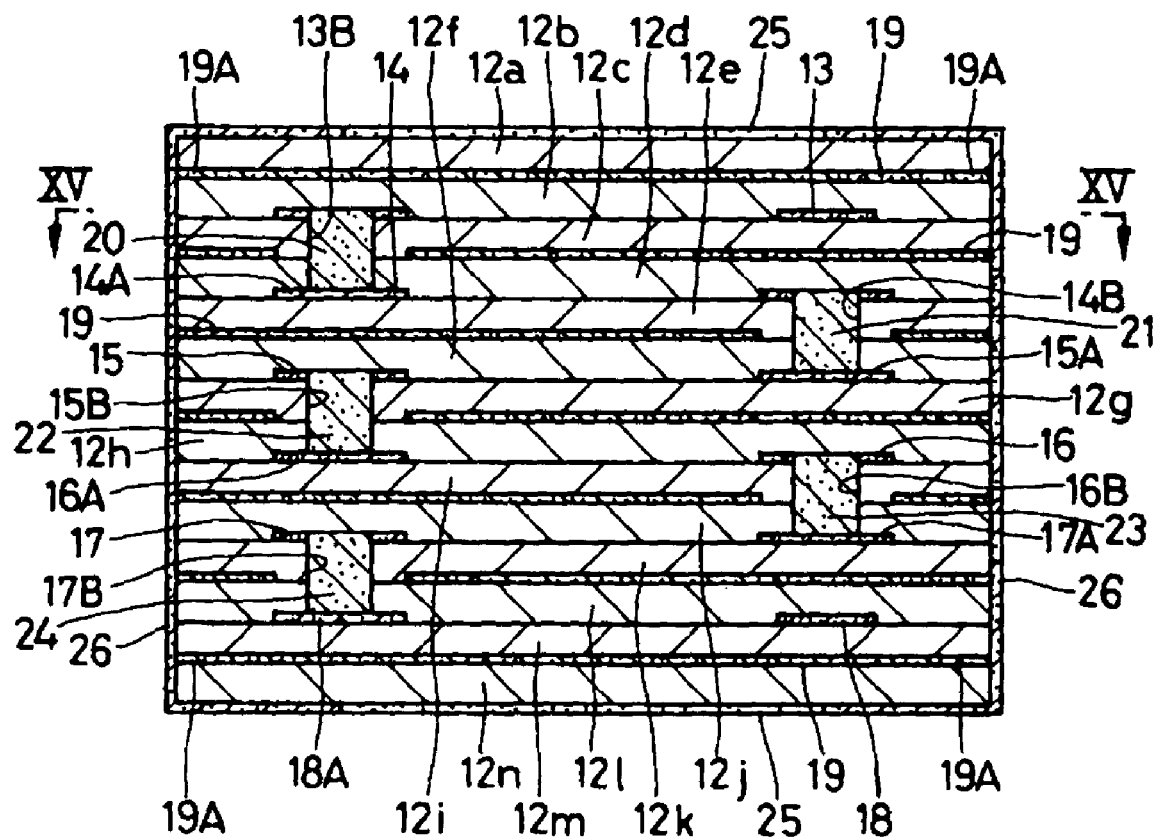
FIG. 14 is a cross-sectional view of the noise filter taken in the direction arrow XIV—XIV of FIG. 12.
Figure 15:
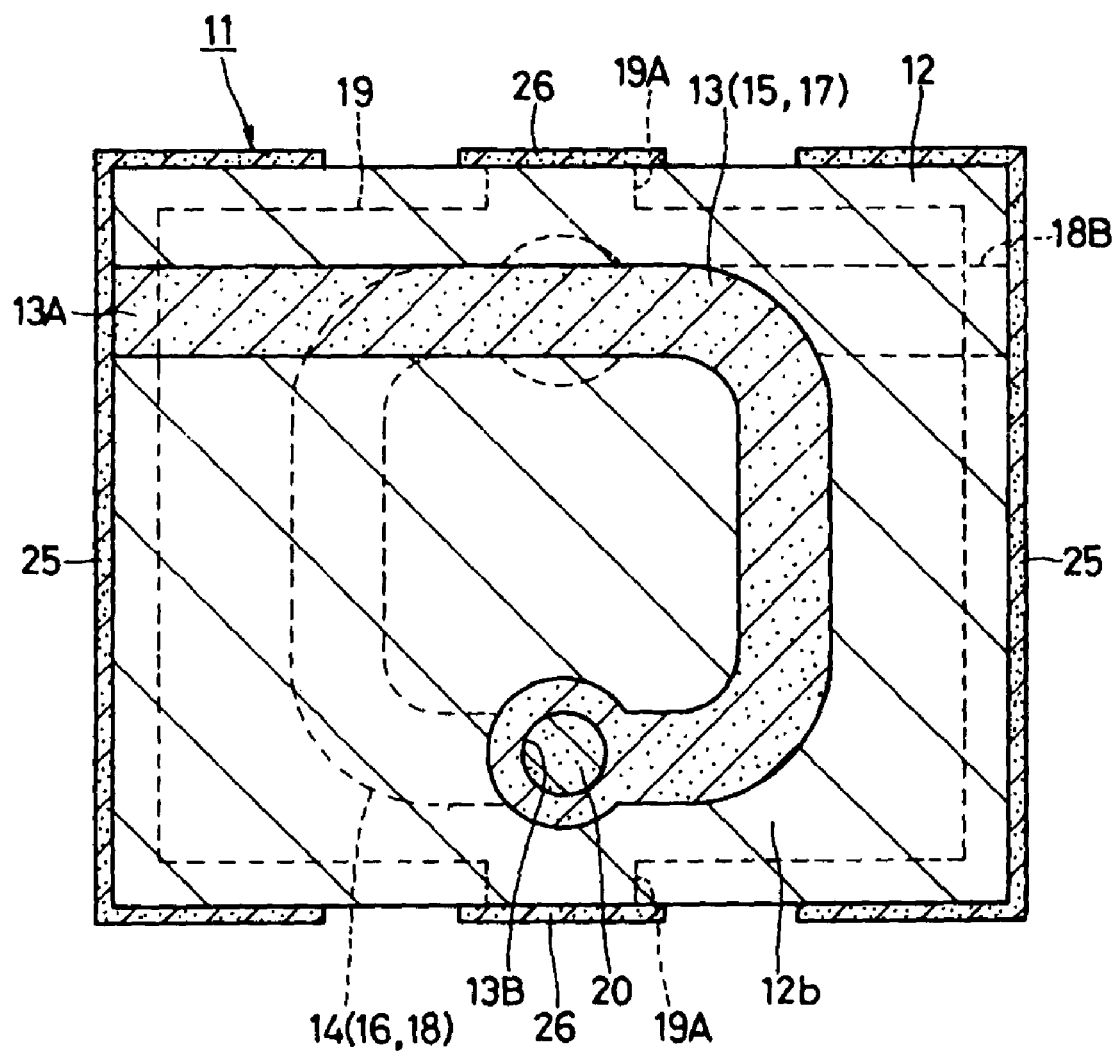
FIG. 15 is a cross-sectional view of the noise filter taken in the direction arrow XV—XV of FIG. 14.
Figure 16:
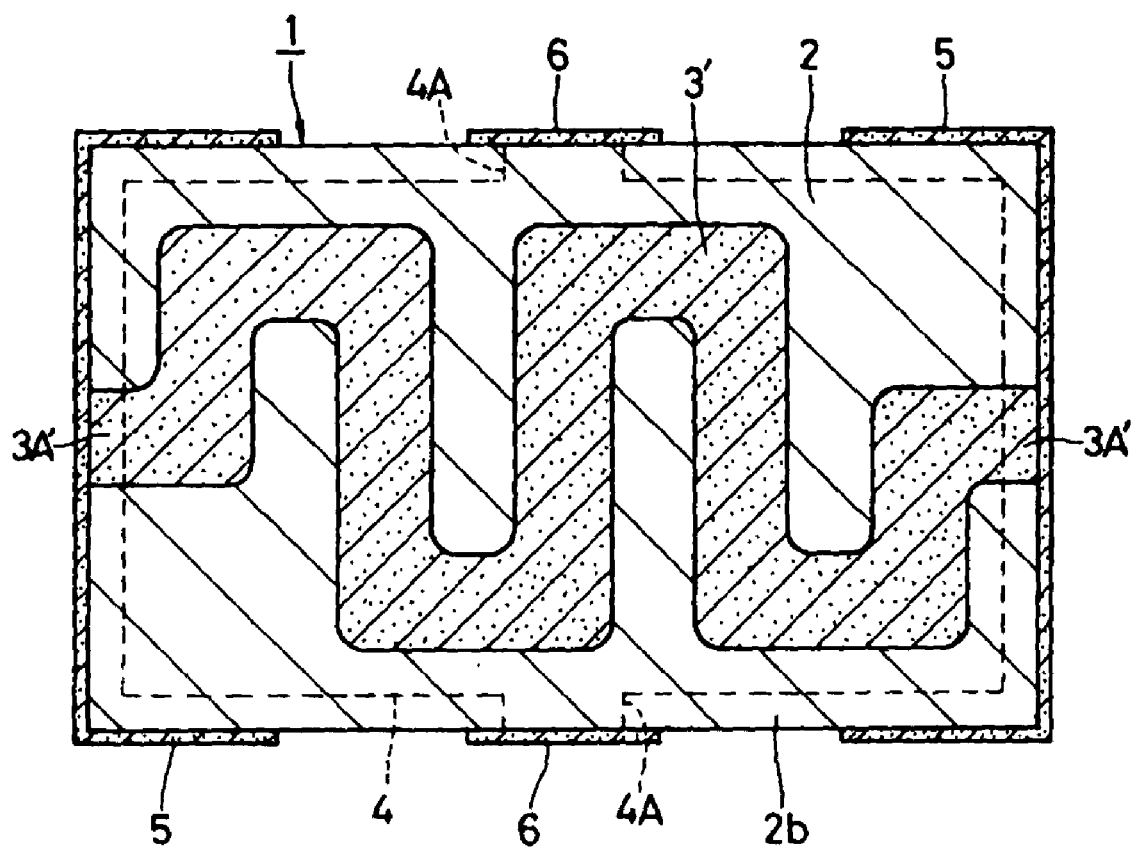
FIG. 16 is a cross-sectional view of a noise filter according to a first modification example taken at the position similar to that in the case of FIG. 5.

It is seen in the results of FIGS. 8 and 9 that in the case of the equal relative permeabilities μr, the cut-off frequency fc (the frequency at which the attenuation is −3 dB) is enhanced with decreasing of the constant C. Thus, to reveal the highest cut-off frequency fc of the noise filter 1, the constant C was set at 3 mm (C=3 mm), and the relation between the relative permeability μr and the cut-off frequency fc was investigated. FIG. 11 shows the results.

In recent years, wireless LAN has been spread as means for transmitting information between digital equipments. High frequency signals with frequencies of about 2.45 GHz and about 5 GHz are used for the wireless LAN. Thus, to protect low frequency signals (about several hundred MHz) in a digital equipment from the above-described high frequency signals, it is required to provide a noise filter having a cut-off frequency of up to 2 GHz. As a result of the investigation on the results of FIG. 11, it is seen that the relative permeability μr may be set at about 4 for setting of the cut-off frequency fc at 2 GHz.

The constant C is inversely proportional to $\sqrt{(\mu r-1)}$ as seen in the numerical formula 5. When the L of the transmission line 3 is constant, the constant C can be increased and the slope of the attenuation curve can be also increased by setting of the relative permeability μr at a small value. Moreover, when the constant C is kept at a constant value, the length L of the transmission line 3 can be decreased, and the size of the noise filter 1 can be reduced by setting of the relative permeability μr at a small value.

Accordingly, preferably, the relative permeability μr is set at the smallest possible value, e.g., at about 4. However, according to the results of FIG. 11, when the constant C is set at the minimum value, that is, 3 mm (C=3 mm), the cut-off frequency fc can be set at about 200 MHz which is required for digital equipments and so forth, even if the relative permeability μr is set at about 30. Therefore, it is preferred to set the relative permeability at a value within the range of from 4 to 30 (4≦μr≦30).

Moreover, the constant C is increased with increasing of the length L of the transmission line 3. Accordingly, preferably, the size L is set at the largest possible value. However, the overall size of the noise filter 1 is increased with increasing of the length L. Therefore, to produce the noise filter 1 having a practically suitable size, the length L is required to be up to 100 mm. Since the minimum value of the relative permeability μr is 4, the maximum value of the constant C is about 20. Accordingly, it is preferable to set the constant C at a value within the range of from 3 mm to 20 mm (3 mm≦C≦20 mm).

As described above, according to this embodiment, the transmission line is disposed between the two magnetic sheets 2b and 2c, and moreover, these magnetic sheets 2b and 2c are covered with the two ground conductors 4. Accordingly, noise can be suppressed by use of the heat loss of the magnetic material constituting the magnetic sheets 2b and 2c. Moreover, the characteristic impedance W of the transmission line 3 can be kept substantially at a constant value, irrespective of the frequency of a signal. Thus, the impedance matching with an external circuit can be easily attained. Therefore, the reflection loss of the noise filter 1 can be reduced, and the noise, which may be caused by resonance, can be prevented from increasing.

The transmission line, which is positioned between the magnetic sheets 2b and 2c, can be covered over the whole length thereof with the two ground conductors 4. Therefore, the characteristic impedance of the transmission line 3 can be kept at a constant value over the whole length thereof. No noise reflects on the way of the transmission line 3, and moreover, a signal while it is being transmitted through the transmission line 3 can be confined between the ground conductors 4. Therefore, the attenuation of a signal in the pass-band can be prevented, and moreover, incorporation of external noise into the transmission line 3 can be prevented. Thus, a signal can be securely transmitted.

Furthermore, the magnetic sheets 2a and 2d are formed in a substantially quadrangular shape. The signal electrodes 5 are provided on both the end-sides in the longitudinal direction of the magnetic sheets 2a to 2d so as to be connected to both the ends of the transmission line 3. The ground electrodes 5 connected to the ground conductors 4 are provided in the middle positions in the longitudinal direction of the magnetic sheets 2a to 2d. Accordingly, the signal electrodes 5 positioned on both the end-sides in the longitudinal direction of the magnetic sheets 2a to 2d can be easily connected to a linearly-extended wiring on the way thereof. Moreover, the ground electrodes 6, provided in the middle positions in the longitudinal direction of the magnetic sheets 2a to 2d, can be easily connected to ground terminals which are provided on the periphery of the wiring. Thus, the integration-property of the noise filter 1 can be enhanced.

Furthermore, the relative permeability $\mu r$ of the magnetic sheets 2b and 2c is set to be within the range of $4 \leq \mu r \leq 30$, and moreover, the length L of the transmission line is set so that the constant C is at least 3 mm ($C \geq 3$ mm). Accordingly, the cut-off frequency fc can be easily set to be within the range of 200 MHz$\leq$fc$\leq$2 GHz which is suitable for practical application. The slope of the attenuation curve of noise tends to increase in proportion to the length L of the transmission line 3 and also increase in reverse proportion to $\sqrt{(\mu r-1)}$. Therefore, the slope of an attenuation curve for noise can be set e.g., at 20 dB/dec. or higher by setting of the relative permeability $\mu r$ of the magnetic sheets 2b and 2c to be within the range of $4 \leq \mu r \leq 30$ and also by setting the constant C at 3 mm or larger. As a result, the difference between the attenuations of a signal and noise can be increased. Thus, the signal can be passed without being attenuated, and the noise can be securely attenuated.

FIGS. 12 to 15 show a noise filter according to a second embodiment of the present invention. Characteristically, the noise filter of this embodiment has a configuration in which transmission lines and ground conductors are alternately laminated in such a manner that the uppermost and lowermost layers of the magnetic sheets contain ground conductors, respectively.

A noise filter 11 comprises below-described magnetic sheets 12a to 12n, transmission lines 13 to 18, ground conductors 19, passing-through lines 20 to 24, signal electrodes 25, and ground electrodes 26.

The laminate 12 has a substantially prism-shape which constitutes the outline of the noise filter 11. The laminate 12 is formed by overlaying, e.g., fourteen magnetic sheets 12a to 12n, pressing them in the laminated state, and firing these magnetic sheets 12a to 12n. Each of the magnetic sheets 12a to 12n is formed in a substantially quadrangular 10 sheet shape, and for example, is formed with a ceramic material having a magnetic property such as ferrite or the like.

The transmission lines 13 to 18 are disposed between a set of the magnetic sheets 12b and 12c, between a set of the magnetic sheets 12d and 12e, between a set of the magnetic sheets 12f and 12g, between a set of the magnetic sheets 12h and 12i, between a set of the magnetic sheets 12j and 12k, and between a set of the magnetic sheets 12l and 12m, respectively. Each of the transmission lines 13 to 18 is formed with an electroconductive metallic material in a substantially U-character shape or circular shape containing a turning-portion. These transmission lines 13 to 18 are connected in series with each other so as to form a frame-shaped coil having a substantially quadrangular or circular opening in the thickness direction of the laminate 12.

Referring to the transmission line 13 between the magnetic sheets 12b and 12c positioned on the upper layer side, one end of the line 13 constitutes an electrode portion 13A which is extended on the one-end side in the longitudinal direction of the laminate 12 and is connected to a below-described signal electrode 25. A through-hole 13B passing through the magnetic sheets 12c and 12d is formed on the other end side of the transmission line 13.

Referring to the transmission line 14 between the magnetic sheets 12d and 12e, a connecting portion 14A which is connected to the transmission line 13 through the through-hole 13B is formed on one-end side of the line 14. A through-hole 14B passing through the magnetic sheets 12e and 12f is formed on the other end side of the line 14.

Similarly, for the transmission line 15 between the magnetic sheets 12f and 12g, a connecting portion 15A is provided on one end side of the line 14, and a through-hole 15B is also provided on the other end side. Moreover, for the transmission line 16 between the magnetic sheets 12h and 12i, a connecting portion 16A is provided on one end side of the line 16, and a through-hole 16B is also provided on the other end side. Furthermore, for the transmission line 17 between the magnetic sheets 12j and 12k, a connecting portion 17A is provided on one end side of the line 17, and a through-hole 17B is also provided on the other end side.

Also, for the transmission line 18 between the magnetic sheets 12l and 12m positioned on the lower layer side, a connecting portion 18A which is connected to the transmission line 17 through the through-hole 17B is formed on one end side thereof. The other end side of the line 4 constitutes an electrode portion 18B which is extended to the other end side in the longitudinal direction of the laminate 12 and is connected to a signal electrode 25 which will be described below.

The characteristic impedances of the transmission lines 13 to 18 are determined by the widths of the transmission lines 13 to 18, the distances between adjacent ground conductors 19, and the relative permeability and the dielectric constant of the laminate 12, similarly to the transmission line 3 of the first embodiment. Therefore, the characteristic impedance over the whole length of the transmission lines 13 to 18 can be set at a constant value by setting of the widths of the transmission lines 13 to 18 substantially at the same value and also by setting the thicknesses of the magnetic sheets 12b to 12m substantially at the same value.

The ground conductors 19 are formed between the magnetic sheets 12a to 12n so as to sandwich the transmission lines 13 to 18 of the respective layers. The ground conductors 19 are disposed as the uppermost and lowermost layers of the magnetic sheets 12b to 12m, respectively, and are overlaid alternately with the transmission lines 13 to 18 between the magnetic sheets 12b to 12m. Moreover, the ground conductors 19 are formed with an electroconductive metallic material in a substantially quadrangular flat sheet, respectively, and cover substantially the whole surfaces of the magnetic sheets 12b to 12m. Moreover, electrode portions 19A are formed in the ground conductors 19 so as to protrude toward both the end-sides in the width direction, respectively, as in the case of the ground conductors 4 of the first embodiment. The electrode portions 19A are connected to ground electrodes 26 which will be described below.

The passing-through lines 20 to 24 are conductors which connects the transmission lines 13 to 18 in series with each other. The passing-through lines 20 to 24 are formed by filling an electroconductive metallic material such as silver paste, palladium, or the like into the through-holes 13B to 17B, respectively.

The signal electrodes 25 are provided on both the end-sides in the longitudinal direction of the laminate 12 (magnetic sheets 12a to 12n). The signal electrodes 25 cover the end-faces of the laminate 12, and also cover the front- and back-faces and the side-faces thereof so as to have a cylindrical shape, respectively, similarly to the signal electrodes 5 of the first embodiment. The signal electrodes 25 are formed by coating an electroconductive metallic material and firing it, and are connected to the electrode portions 13A and 18B of the transmission lines 13 and 18.

The ground conductors 26 are formed in the middle positions in the longitudinal direction of the laminate 12, on both the end sides in the width direction of the laminate 12. Each of the ground conductors 26 has a substantially U-character shape. The ground conductor 26 is extended in a belt-pattern on the side-face of the laminate 12 in the thickness direction thereof, and a part of the ground conductor 26 is extended on the front- and back-faces of the laminate 12. The ground conductors 26 are formed, e.g., by coating an electroconductive metallic material onto the side-face sides of the laminate 12 and firing it, and are connected to the electrode portions 19A of the ground conductors 19, respectively.

Thus, according to this embodiment constituted as described above, the same advantages as those of the first embodiment can be obtained. Especially, since the six-layer transmission lines 13 to 18 are connected in series with each other by means of the passing-through lines 20 to 24 formed so as to pass through the respective magnetic sheets 12c to 12l, the overall length of the transmission lines 13 to 18 can be increased. Thus, the heat loss with respect to noise transmitting through the transmission lines 13 to 18 can be increased, and the attenuation can be enhanced.

Moreover, the characteristic impedances of the transmission lines 13 to 18 contained in the respective layers of the laminate can be made substantially equal to each other by setting of the widths of the transmission lines 13 to 18 at substantially the same value, and also by setting the thicknesses of the magnetic sheets 12b to 12m substantially at the same value. Accordingly, the characteristic impedance can be prevented from changing on the way of the transmission lines 13 to 18. The impedance matching with an external circuit can be easily attained.

Moreover, the transmission lines 13 to 18 are formed in a substantially U-character or circular shapes so that a coil is formed by all of the transmission lines 13 to 18. Accordingly, although the thickness of the noise filter 11 becomes large to some degree, the bottom area of the noise filter 11 can be set to be nearly equal to the opening area of the transmission lines 13 to 18 which form a coil. Therefore, the noise filter 11 can be arranged even in a narrow mounting-space. Thus, the mounting-flexibility of the noise filter 11 can be enhanced.

According to the first embodiment, the transmission line is extended in a linear line pattern. A transmission line 3' having a zigzag pattern, which meanders, repeatedly turning around in the width direction of the laminate 2, may be formed as seen in the first modification example of FIG. 16. Further, a transmission line (not shown) having a zigzag pattern, which meanders, repeatedly turning around in the longitudinal direction of the laminate 2, may be formed.

In the case where the transmission line 3' is formed in a zigzag pattern as described above, the length can be increased compared to the case where the transmission line 3 is formed in a linear line pattern as in the first embodiment. Thus, the attenuation of noise can be enhanced.

Moreover, according to the second embodiment, the transmission lines 13 to 18 are formed in a substantially U-character or circular shape, respectively. The transmission lines may be formed in a zigzag pattern or a spiral pattern similarly to the first modification example.

Figure 17:
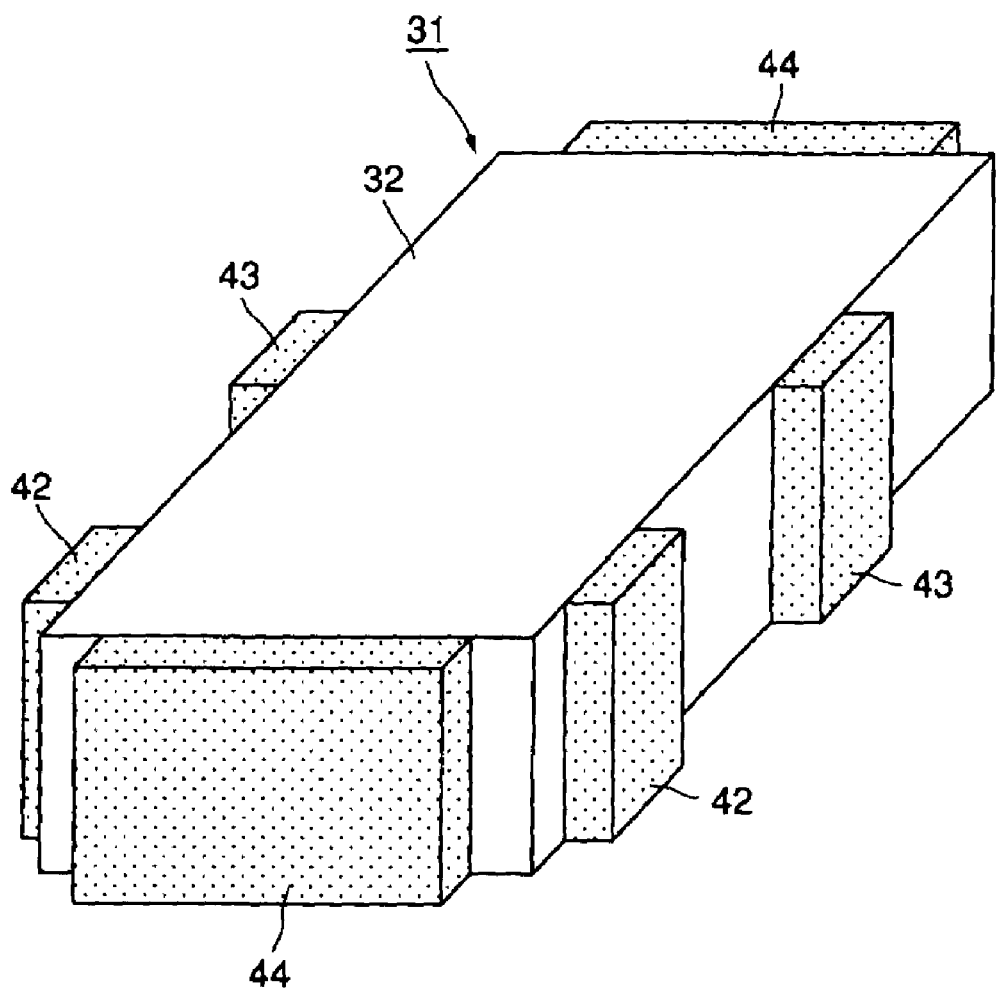
FIG. 17 is a perspective view of a noise filter according to a third embodiment.
Figure 18:
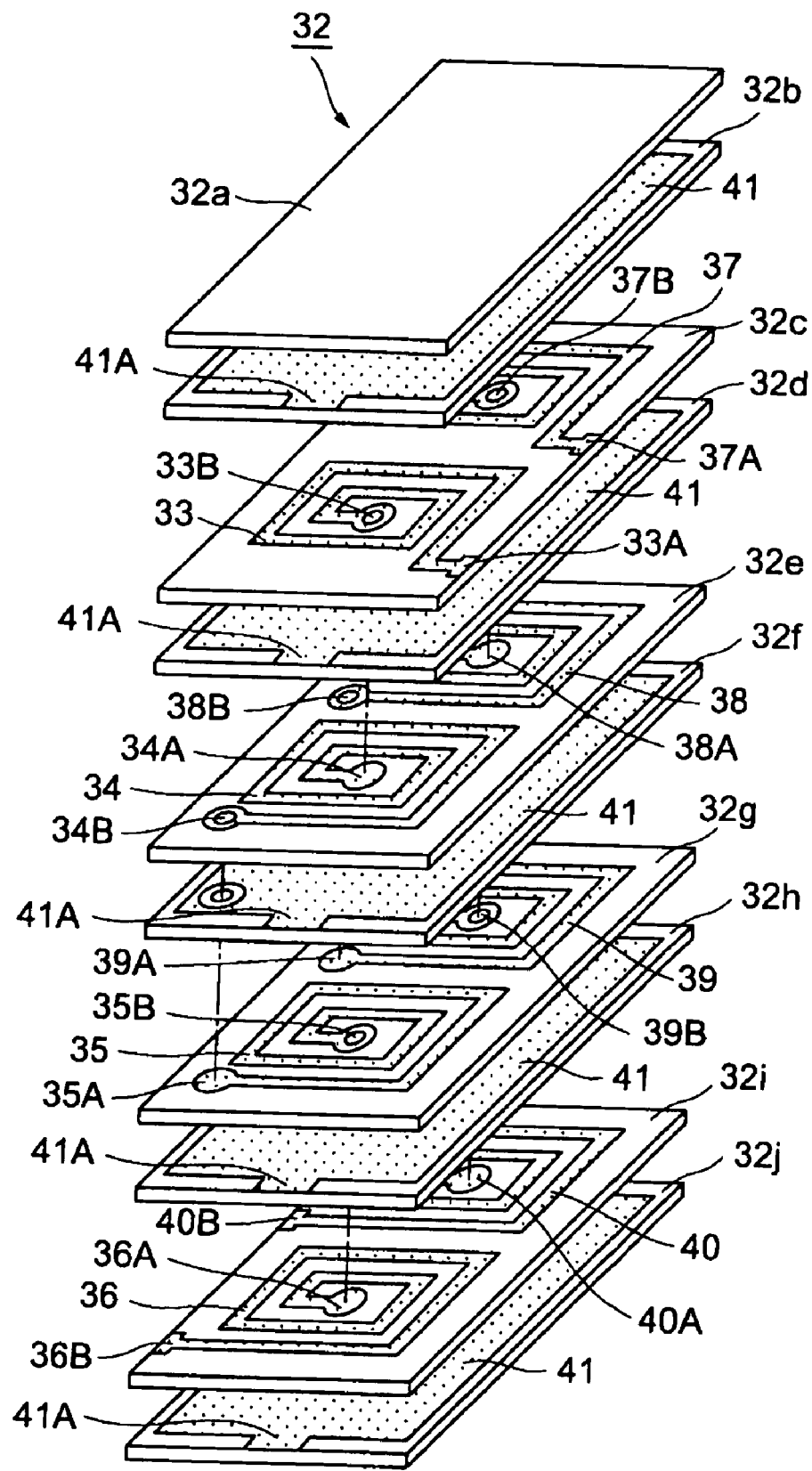
FIG. 18 is an exploded perspective view of the noise filter, which is exploded, of the third embodiment.

FIGS. 17 and 18 show a noise filter according to a third embodiment of the present invention. Characteristically, in the noise filter of this embodiment, first and second transmission lines are provided on the same layer between magnetic sheets. First transmission lines and second transmission lines, and magnetic sheets are alternately overlaid, so that the plural first transmission lines are connected in series with each other, and moreover, the plural second transmission lines are connected in series with each other, independently of the first transmission lines.

A noise filter 31 comprises magnetic sheets 32a to 32j, first transmission lines 33 to 36, second transmission lines 37 to 40, ground conductors 41, passing-through lines (not shown), first signal electrodes 42, second signal electrodes 43, and ground conductors 44, which will be described below.

The laminate 32 has a substantially prism shape, which defines the outline of the noise filter 31. The laminate 32 is formed by laminating, e.g., ten magnetic sheets 32a to 32j. Each of the magnetic sheets 32a to 32j is formed with a ceramic material such as ferrite or the like having a magnetic property, into a substantially quadrangular shape.

The first transmission lines 33 to 36 are formed between a set of the magnetic sheets 32b and 32c, between a set of the magnetic sheets 32d and 32e, between a set of the magnetic sheets 32f ad 32g, and between a set of the magnetic sheets 32h ad 32i, respectively. That is, total four layers are provided. The transmission lines 33 to 36 each are formed with an electroconductive metallic material in a spiral pattern, and are arranged in opposition to each other in the thickness direction of the laminate 32, respectively.

In this case, one-end side of the transmission line 33 forms an electrode portion 33A which is extended toward one-end side in the longitudinal direction (the right and left side direction in FIG. 18) of the laminate 32. The other-end side of the transmission line 33 is positioned in the center of the spiral pattern, and is provided with a through-hole 33B passing-through the magnetic sheets 32c and 32d.

One-end side of the transmission line 34 is positioned in the center of the spiral pattern and is provided with a connecting portion 34A to be connected to the transmission line 33 through the through-hole 33B. The other-end side of the transmission line 34 is positioned on the outer peripheral side of the spiral pattern and is provided with a through-hole 34B passing-through the magnetic sheets 32e and 32f. Similarly, one-end side of the transmission line 35 is positioned on the outer peripheral side of the spiral pattern and is provided with a connecting portion 35A. The other-end side of the transmission line 35 is positioned in the center of the spiral pattern and is provided with a through-hole 35B.

Moreover, one-end side of the transmission line 36 is positioned in the center of the spiral pattern, and is provided with a connecting portion 36A to be connected to the transmission line 35 through the through-hole 35B. The other-end side of the transmission line 36 is positioned on the outer peripheral side of the spiral pattern, and constitutes an electrode portion 36B which is extended toward the other end side in the longitudinal direction of the laminate 32. A passing-through line (not shown) is formed with an electroconductive metallic material in the through-holes 33B, 34B, and 35B as in the case of the second embodiment. Thereby, the transmission lines 33 to 36 are connected in series with each other by means of the passing-through line.

Moreover, the widths of the transmission lines 33 to 36 are set substantially at the same value, and also, the thicknesses of the magnetic sheets 32b to 32i are set substantially at the same value. Thus, the characteristic impedance of the transmission lines 33 to 36 is set to be constant over the whole length thereof.

The second transmission lines 37 to 40 are formed between a set of the magnetic sheets 32b and 32c, between a set of the magnetic sheets 32d and 32e, between a set of the magnetic sheets 32f ad 32g, and between a set of the magnetic sheets 32h ad 32i, respectively. That is, total four layers are provided. The second transmission lines 37 to 40 are arranged in positions different from those of the first transmission lines 33 to 36, that is, the second transmission lines are arranged so as to be shifted from the first transmission lines 33 to 36 in the width direction (the front-rear direction in FIG. 18), and are electrically insulated from the first transmission lines 33 to 36. Moreover, the transmission lines 37 to 40 each are formed with an electroconductive metallic material in a spiral pattern, and are arranged in opposition to each other in the thickness direction of the laminate 32.

The second transmission lines 37 to 40 are formed substantially in the same pattern as the first transmission lines 33 to 36, respectively. An electrode portion 37A is formed on one-end side of the transmission line 37. A through-hole 37B is provided on the other-end side of the transmission line 37. Similarly, connecting portions 38A and 39A are formed on one-end sides of the transmission line 38 and 39, respectively. Through-holes 38B and 39B are formed on the other-end sides of the transmission lines 38 and 39, respectively. Moreover, a connecting portion 40A is provided on one-side of the transmission line 40, and an electrode portion 40B is formed on the other-end side of the transmission line 40.

Moreover, passing-through lines (not shown) are formed with an electroconductive metallic material in the through-holes 37B, 38B, and 39B, respectively. Thereby, the transmission lines 37 to 40 are connected in series with each other by means of the passing-through lines.

Moreover, the widths of the transmission lines 37 to 40 are set substantially at the same value, and also, the thicknesses of the magnetic sheets 32b to 32i are set substantially at the same vale. Thereby, the characteristic impedances of the transmission lines 37 to 40 are set to be substantially constant over the whole length thereof.

The ground conductors 41 are formed between the magnetic sheets 32a to 32j in such a manner as to sandwich the first transmission lines 33 to 36 and the second transmission lines 37 to 40, respectively, for each layer of the laminate.

The ground conductors 41 are arranged as the uppermost and lowermost layers of the magnetic sheets 32b to 32i. The first transmission lines 33 to 36 and the second transmission lines 37 to 40 are alternately overlaid.

Moreover, the ground conductors 41 are formed with an electroconductive metallic material in a substantially quadrangular flat sheet, respectively, and cover substantially the whole surfaces of the magnetic sheets 32b to 32i. Moreover, the ground conductors 41 are provided with electrode portions 41A protruding toward the both end-sides in the width-direction, respectively, similarly to the ground conductors 4 according to the first embodiment. The electrode portions 41A are connected to the ground electrodes 44 which will be described below.

First signal electrodes 42 are formed on both the end-sides in the longitudinal direction of the laminate 32 (the magnetic sheets 32a to 32j), respectively. The signal electrodes 42 are formed with an electroconductive metallic material, and are connected to a wiring for a signal. One of the signal electrodes 42 is connected to the electrode portion 33A of the transmission line 33, and the other signal electrode 42 is connected to the electrode portion 36B of the transmission line 36.

The second signal electrodes 43 are formed on both the end-sides in the longitudinal direction of the laminate 32 (the magnetic sheets 32a to 32j), respectively. The signal electrodes 43 are formed with an electroconductive metallic material, are positioned so as to be shifted from the first signal electrodes 42 in the width direction of the laminate 32, and are insulated from the first signal electrodes 42. One of the signal electrodes 43 is connected to the electrode portion 37A of the transmission line 37, and the other signal electrode 43 is connected to the electrode portion 40B of the transmission line 40.

For example, the one signal electrodes 42 and 43 function as signal-input electrodes, and the other signal electrodes 42 and 43 function as signal output electrodes. However, the one signal electrodes 42 and 43 may be used for signal-outputting, and the other signal electrodes 42 and 43 may be used for signal-inputting.

The ground electrodes 44 are formed on both the end-sides in the width direction of the laminate 32. The ground electrodes 44 are formed with an electroconductive metallic material and connected to the electrode portions 41A of the ground conductors 41, respectively.

According to this embodiment configured as described above, substantially the same advantages of those of the first embodiment can be obtained.

However, according to this embodiment, the first transmission lines 33 to 36 are connected in series with each other, and also, the second transmission lines 37 to 40 are connected in series with each other. Accordingly, the overall length of the first transmission lines 33 to 36 and that of the second transmission lines 37 to 40 can be increased, respectively. Thus, the attenuation of noise can be increased.

Moreover, the first and second transmission lines 33 to 36 and 37 to 40 are formed independently of each other. A low-pass filter comprising the first transmission lines 33 to 36 and a low-pass filter comprising the second transmission lines 37 to 40 can be provided in a single laminate 32. Therefore, regarding the noise filter 41, as a whole, a noise filter array containing two low-pass filters can be formed. Accordingly, the ground conductors 41, the ground electrodes 44, and so forth can be used in common in contrast to the case in which two low pass filters are formed independently of each other. Thus, the size of the noise filter 31 can be reduced.

Figure 19:
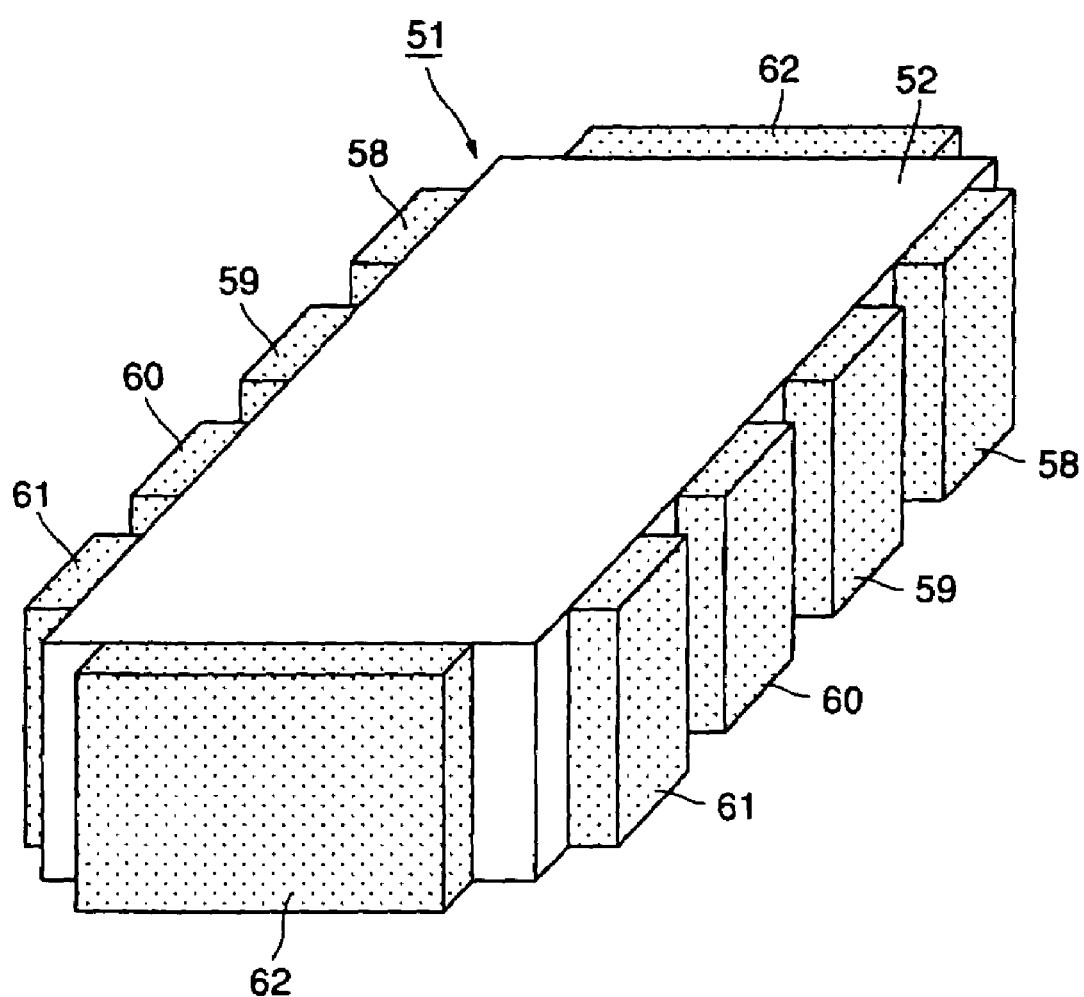
FIG. 19 is a perspective view of a noise filter according to a noise filter according to a fourth embodiment.
Figure 20:
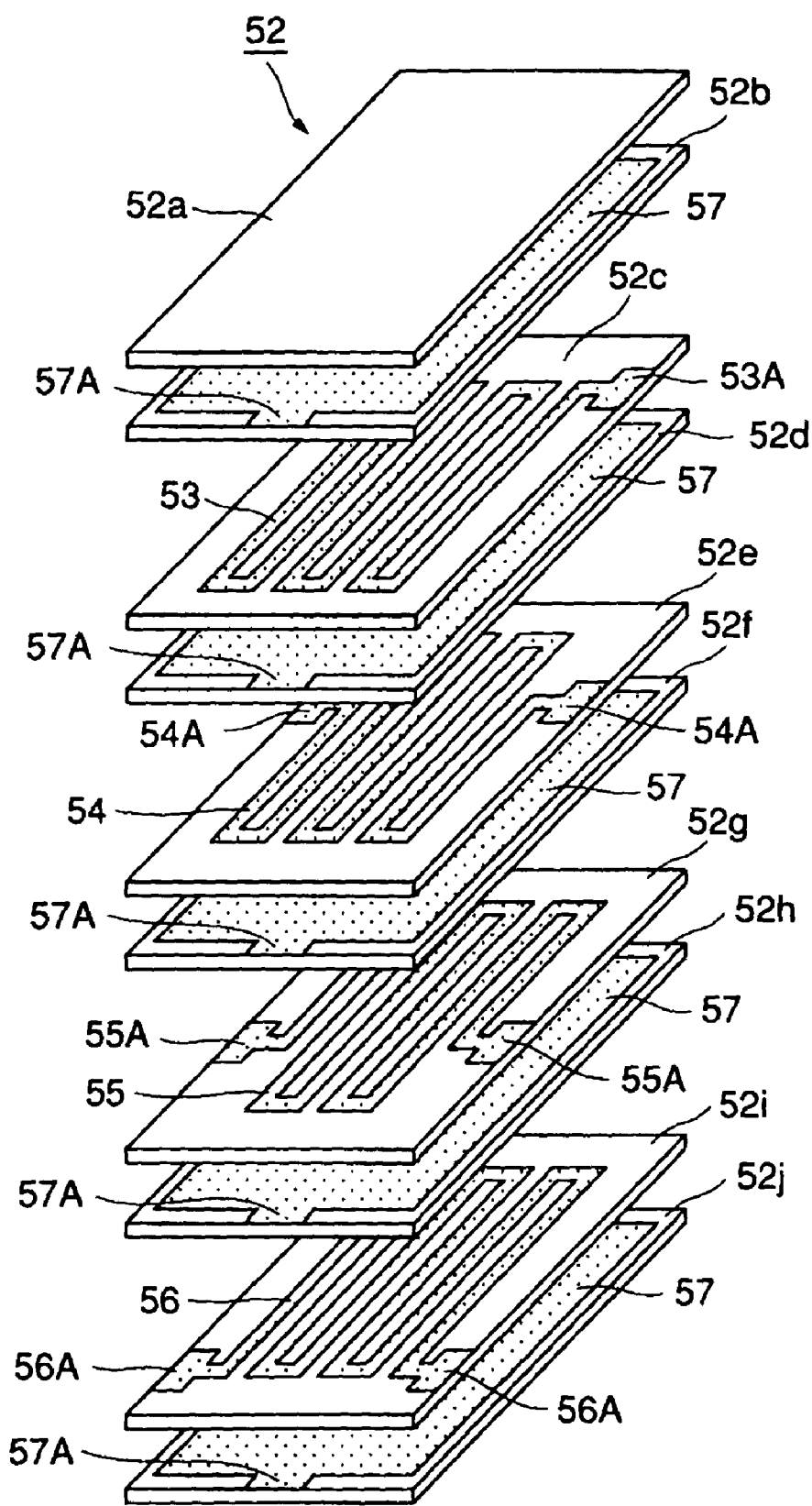
FIG. 20 is an exploded perspective view of the noise filter, which is exploded, of the fourth embodiment.
Figure 21:
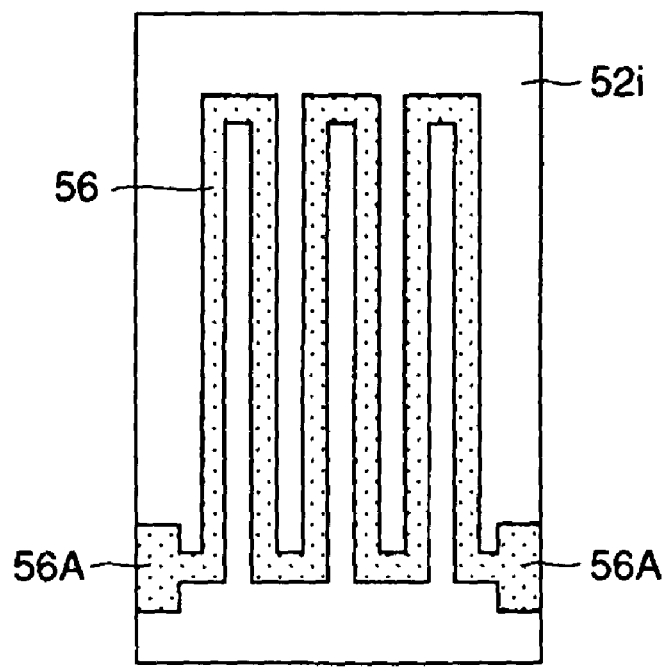
FIG. 21 is a plan view of the fourth transmission line of the transmission lines shown in FIG. 20.
Figure 22:
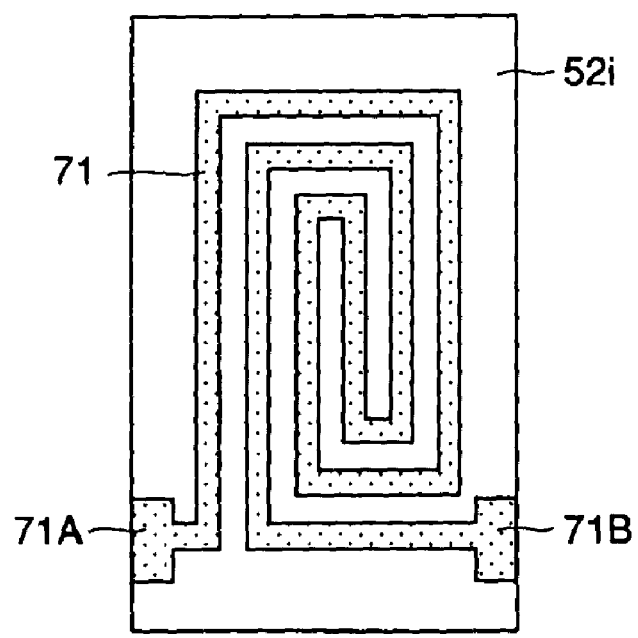
FIG. 22 is a plan view of a transmission line according to a second modification example.

FIGS. 19 and 21 show a noise filter according to a fourth embodiment of the present invention. Characteristically, in the noise filter of this embodiment, transmission lines and ground conductors are alternately overlaid between magnetic sheets in such a manner that the uppermost and lowermost layers of the magnetic sheets are made of the ground conductors. One-end sides of the transmission lines each contained in the plural layers are connected to signal input electrodes which are different from each other, and the other-end sides of the transmission lines each contained in the plural layers are connected to signal output electrodes which are different from each other.

A noise filter 51 comprises magnetic sheets 52a to 52j, first to fourth transmission lines 53 to 56, ground conductors 57, first to fourth signal electrodes 58 to 61, and ground conductors 62, which will be described below.

A laminate 52 has a substantially prism shape which constitutes the outline of the noise filter 51. The laminate 32 is formed by, e.g., laminating ten magnetic sheets 52a to 52j. The magnetic sheets 52a to 52j are formed into a sheet shape, respectively, and are made of a ceramic material having a magnetic property such as ferrite or the like.

A first transmission line 53 is provided between the magnetic sheets 52b and 52c. The transmission line 53 is formed with an electromagnetic metallic material in a thin belt pattern, and has such a zigzag pattern as to meander turning around several times in the width direction of the laminate 52 (the front-rear direction in FIG. 20). On both the end sides of the transmission line 53, electrode portions 53A are formed so as to be extended in the longitudinal direction (the left-right side of FIG. 20) of the laminate 52 toward both the end-sides. These electrode portions 53A are arranged e.g., on one-end sides in the width direction of the laminate 52.

A second transmission line 54 is provided between the magnetic sheets 52d and 52e. The transmission line 54 is formed with an electromagnetic metallic material in a meandering-zigzag pattern similarly to the first transmission line 53. On both the end sides of the transmission line 54, electrode portions 54A are formed so as to be extended in the longitudinal direction toward both the end-sides of the laminate 52. These electrode portions 54A are arranged in positions different from those of the first electrode portions 53A, for example, are arranged in the centers in the width direction of the laminate 52.

A third transmission line 55 is provided between the magnetic sheets 52f and 52g. The transmission line 55 is formed with an electromagnetic metallic material in a meandering-zigzag pattern similarly to the first transmission line 53. On both the end sides of the transmission line 55, electrode portions 55A are formed so as to be extended in the longitudinal direction toward both the end-sides of the laminate 52. These electrode portions 55A are arranged in positions different from those of the first electrode portions 53A and the second electrode portions 54A, for example, are arranged in the middle positions between the second electrode portions 54A and the other-ends in the width direction of the laminate 52, respectively.

A fourth transmission line 56 is provided between the magnetic sheets 52h and 52i. The transmission line 56 is formed with an electromagnetic metallic material in a meandering-zigzag pattern similarly to the first transmission line 53. On both the end sides of the transmission line 56, electrode portions 56A are formed so as to be extended in the longitudinal direction toward both the end-sides of the laminate 52. These electrode portions 56A are arranged in positions different from those of the first to third electrode portions 53A to 55A, for example, are arranged in the other-ends in the width direction of the laminate 52, respectively.

The ground conductors 57 are formed between the magnetic sheets 52a to 52j in such a manner as to sandwich the first to fourth transmission lines 53 to 56, respectively. The ground conductors 57 are arranged on the uppermost and lowermost layers of the magnetic sheets 52b to 52i and also are laminated alternately with the transmission lines 53 to 56 between the magnetic sheets 52b to 52i. The ground conductors 57 are formed with an electroconductive metallic material into a substantially quadrangular flat sheet shape, respectively, and cover substantially the whole surfaces of the magnetic sheets 52b to 52i. Moreover, the ground conductors 57 are provided with electrode portions 57A which are protruded toward the both end-sides similarly to the ground conductors 4. The electrode portions 57A are connected to ground electrodes 62 which will be described below.

The first to fourth signal electrodes 58 to 61 are formed with an electroconductive metallic material. The first to fourth signal electrodes 58 to 61 are provided on the side faces of the laminate 52 which are on the both the end-sides in the longitudinal direction of the laminate 52. In this case, the signal electrodes 58 to 61 are provided so as to be paired, respectively. The first to fourth signal electrodes 58 to 61 are arranged in different positions in the width direction of the laminate 52, for example, are arranged sequentially from one-end side to the other end side in the width direction of the laminate 52, and are insulated from each other.

The first signal electrodes 58 are connected to the electrode portions 53A of the first transmission lines 53. The second signal electrodes 59 are connected to the electrode portions 54A of the second transmission lines 54. The third signal electrodes 60 are connected to the electrode portions 55A of the third transmission lines 55. The fourth signal electrodes 61 are connected to the electrode portions 56A of the fourth transmission lines 56.

Of the first to fourth signal electrodes 58 to 61 provided so as to be paired, respectively, the signal electrodes 58 to 61 positioned on one side constitute signal input electrodes, and the signal electrodes 58 to 61 positioned on the other side constitute signal output electrodes.

The ground electrodes 62 are provided on both the end-sides in the width direction of the laminate 52. The ground electrodes 62 are formed with an electroconductive metallic material and connected to the electrode portions 57A of the ground conductors 57.

Therefore, according to this embodiment configured as described above, substantially the same advantages as those of the first embodiment can be obtained. On the other hand, in this embodiment, the transmission lines 53 to 56 contained in the plural layers are connected to the signal electrodes 58 to 61 which are different from each other, so that the transmission lines 53 to 56 contained in the plural layers can be operated as low pass filters, individually. Thus, as a whole, a noise filter array can be formed.

In the case where the plural transmission lines 33 to 36 and 37 to 40 are formed in the same layers, respectively, and the plural layer transmission lines 33 to 36 and 37 to 40 are connected as in the third embodiment, the area of the magnetic sheets 32a to 32j is required to be increased with the number of low-pass filters. Therefore, if a lot of low-pass filters are provided in the noise filter 31, the noise filter 31 tends to have a large size.

On the other hand, according to this embodiment, the plural layer transmission lines 53 to 56 form the low-pass filters which are independent from each other for the respective layers. Accordingly, if the number of the low-pass filters is increased, it is sufficient to increase the number of the magnetic sheets 52a to 52j. Therefore, even in the case where a lot of low-pass filters are provided in the noise filter 51, the noise filter can be reduced in size.

Moreover, in the case in which the plural layer transmission lines 33 to 36 and 37 to 40 are connected through the through-holes 33B to 35B and 37B to 39B (passing-through lines) as in the third embodiment, mismatching tends to occur in the vicinities of the through-holes 33B to 35B and 37B to 39B which have discontinuous points. Moreover, it is required to drill the through-holes 33B to 35B and 37B to 39B and fill an electroconductive paste for the passing-through lines, and so forth. Thus, the number of production processes is increased, and the manufacturing cost tends to increase.

On the other hand, according to this embodiment, the plural layer transmission lines 53 to 56 are operated as low-pass filters independent from each other for the respective layers. Thus, no impedance mismatching occurs on the way of the transmission lines 53 to 56. Therefore, no reflection of noise occurs on the way of transmission lines 53 to 56, resonance of noise can be suppressed, and the impedance matching to an external circuit can be easily attained. Moreover, according to this embodiment, drilling for the through-holes and so forth is not required. Thus, the production process can be simplified, and the manufacturing cost can be reduced.

Moreover, in the case in which the plural transmission lines 33 to 36 and 37 to 40 are formed in the same layers, respectively, as in the third embodiment, crosstalk tends to occur between the adjacent transmission lines 33 to 36 and 37 to 40. Thus, a signal tends to be easily deteriorated.

On the other hand, according to this embodiment, the ground conductors 57 are provided between the transmission lines 53 to 56. Thus, crosstalk can be prevented between the adjacent transmission lines 53 to 56, due to the ground conductors 57, and a signal can be securely propagated.

Moreover, in the case in which the plural layer transmission lines 33 to 36 and 37 to 40 are connected through the through-holes 33B to 35B and 37B to 39B (passing-through lines) as in the third embodiment, the ground conductors 41 are also required to be provided with holes each having a diameter of about 100 μm as the through-holes 33B to 35B and 37B to 39B in order to avoid contacting the passing-through lines. In this case, the transmission lines can not be arranged in the peripheries of the holes. Thus, the area of one magnetic sheet where the transmission lines can be formed is decreased, the transmission lines are reduced, and the noise attenuation tends to be reduced.

On the other hand, according to this embodiment, no through-holes are provided for the magnetic sheets 52a to 52j. Accordingly, the transmission lines 53 to 56 can be arranged on the whole areas of the magnetic sheets 52a to 52j. Therefore, the lengths of the transmission lines can be increased, and the noise attenuation can be enhanced.

Moreover, in the case where the plural layer transmission lines 33 to 36 and 37 to 40 are connected in the thickness direction of the laminate 32 as in the third embodiment, to avoid contact of transmission lines 33 to 36 and 37 to 40, for example, the input signal electrode 42 and the output signal electrode 42 are required to be opposed to each other, and also, the input signal electrode 43 and the output signal electrode 43 are required to be opposed to each other.

On the other hand, according to this embodiment, the plural layer transmission lines 53 to 56 are independent of each other for the respective layers. Thus, the input signal electrodes 58 to 61 and the output signal electrodes 58 to 61 are not required to be opposed to each other, respectively. For this reason, e.g., the input signal electrodes 58 to 61 are arranged sequentially from one side to the other side in the width direction of the laminate 52. However, the input signal electrodes 58 to 61 may be also arranged sequentially from the other side to the one side in the width direction of the laminate 52. Thereby, the input signal electrodes 58 to 61 and the output signal electrodes 58 to 61 can be arranged independently of each other, and thus, the design flexibility can be enhanced.

Moreover, according to this embodiment, the plural layer transmission lines 53 to 56 form low-pass filters which are independent of each other for the respective layers. Therefore, the characteristic impedances of the respective low-pass filters can be made different from each other by setting the thicknesses of the magnetic sheets 52b to 52i at different values. Accordingly, the noise filter 51 of this embodiment can be easily applied to wirings having plural different impedances.

According to the fourth embodiment, the transmission lines 53 to 56 are formed in a zigzag pattern, respectively. The present invention is not restricted to this pattern. For example, a transmission line 71 having a spiral pattern of which both end-sides constitute electrode portions 71A ma be formed as shown in a second modification example of FIG. 22.

Figure 23:
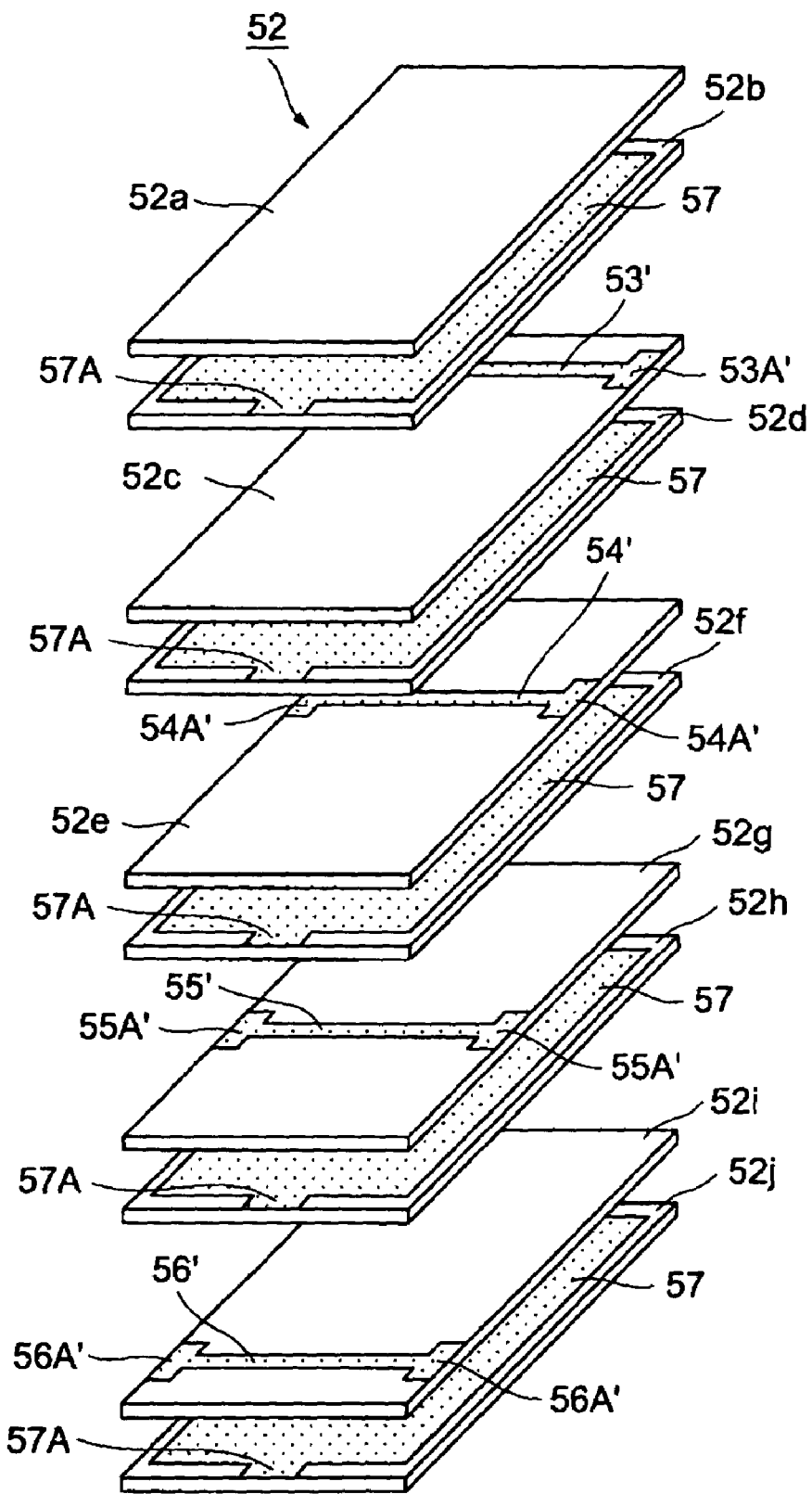
FIG. 23 is an exploded perspective view of a noise filter according to a third modification example, which is exploded.

Moreover, when the lengths of the transmission lines are small as in the case where the cut-off frequency is high, straight-line shaped transmission lines 53' to 56' may be formed as in the third modification example of FIG. 23.

Figure 24:
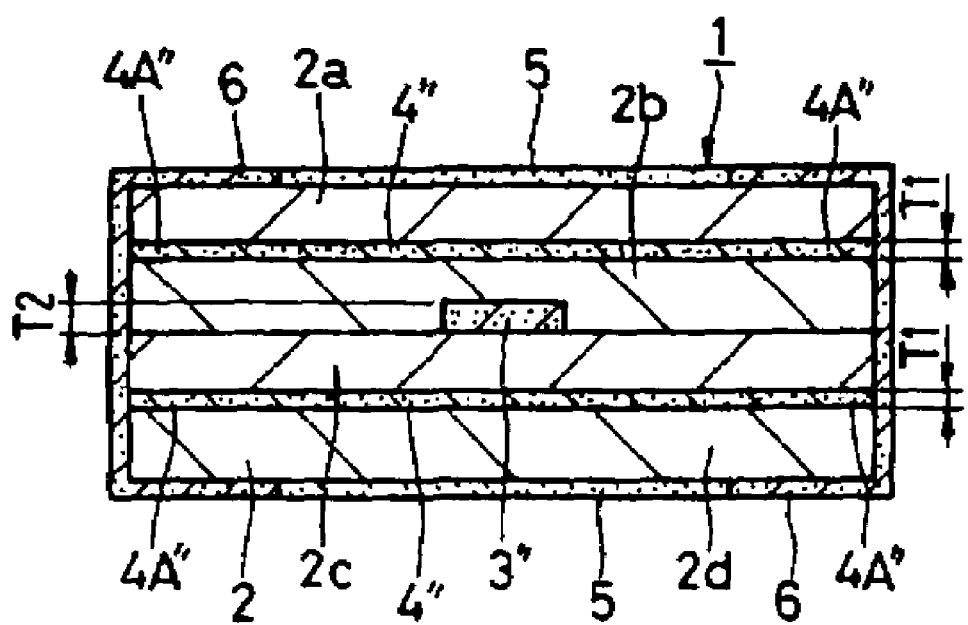
FIG. 24 is a cross-sectional vies of a noise filter according to a fourth modification example, taken in the position similar to that in the case of FIG. 3.

Furthermore, the thickness T1 of a ground conductor 4" may be formed to be smaller than the thickness T2 of a transmission line 3" as shown in a fourth modification example of FIG. 24. Thereby, the overall thickness of the noise filter 1 can be reduced. Thus, the size can be decreased. Moreover, the thickness T2 of the transmission line 3" can be made larger than the thickness T1 of the ground conductor 4". Accordingly, the DC current resistance of the transmission line 3" can be reduced, so that a large current can be caused to flow.

Furthermore, according to the above-described respective embodiments, the magnetic sheets 2a to 2d, 12a to 12n, 32a to 32j, and 52a to 52j are formed with a ceramic material such as ferrite or the like, and fired. However, the present invention is not restricted to this. The magnetic sheets may be formed by mixing magnetic powder such as carbonyl iron or the like with a resin material and forming it. Thereby, the magnetic sheets can be bonded with an adhesive to form a noise filter. Thus, production process such as firing or the like can be omitted. The production efficiency can be enhanced. In this case, the cut-off frequency of the noise filter can be set by use of the composition of magnetic powder contained therein, the ratio of a resin material to the magnetic powder, and the length of a transmission line.

INDUSTRIAL APPLICABILITY

As described above, according to the noise filter of the present invention, the resonance of noise can be prevented. The filter has a small size and is inexpensive, and is useful especially in an electronic device having a signal frequency of higher than 100 MHz.

What is claimed is:

1. A noise filter comprising:
   at least two magnetic sheets overlapping each other;
   at least one transmission line disposed between the at least two magnetic sheets; and
   at least two sheets of ground conductors arranged such that the at least two magnetic sheets are sandwiched by and between said at least two sheets of ground conductors from the upper and lower surfaces thereof; wherein
   a cut-off frequency is in a range of from about 200 MHz to about 2 GHz, the relative permeability μr of each of the at least two magnetic sheets is within a range of about 4 to about 30, and a length L of the at least one transmission line is set so as to satisfy the following expression: $L/\sqrt{(\mu r-1)} \geqq 3$ mm.

2. A noise filter according to claim 1, wherein the at least one transmission lines has one of a substantially arc-shaped configuration and a substantially U-shaped configuration so as to have a coil shape in a thickness direction thereof.

3. A noise filter according to claim 1, wherein the at least one transmission lines has a meandering-zigzag configuration.

4. A noise filter according to claim 1, wherein the at least two magnetic sheets are made of a ceramic material having a magnetic property.

5. A noise filter according to claim 1, wherein the at least two magnetic sheets are made of a resin material including magnetic powder.

6. A noise filter according to claim 1, wherein the at least two magnetic sheets have a substantially quadrangular shape, signal electrodes are disposed on two end surfaces of the at least two magnetic sheets so as to be connected to two ends of the at least one transmission line, and at least two ground electrodes are disposed in approximately central positions in a longitudinal direction of the at least two magnetic sheets so as to be connected to the at least two sheets of ground conductors.

7. A noise filter according to claim 1, wherein a thickness of each of the at least two ground conductor sheets is less than that of the at least one transmission line.

8. A noise filter comprising:
   a plurality of magnetic sheets overlapping each other; a plurality of transmission lines;
   a plurality of ground conductors, the plurality of transmission lines and the plurality of ground conductors being alternately overlapped and interposed between respective ones of the plurality of magnetic sheets, with the uppermost layer and the lowermost layer of the plurality of magnetic sheets having ground conductors arranged thereon; and
   a plurality of pass-through lines arranged such that the plurality of transmission lines are connected in series with each other via the plurality of pass-through lines passing through the respective magnetic sheets; wherein
   a cut-off frequency is in a range of from about 200 MHz to about 2 GHz, the relative permeability μr of each of the plurality of magnetic sheets is within a range of about 4 to about 30, and a length L of each of the plurality of transmission lines is set so as to satisfy the following expression: $L/\sqrt{(\mu r-1)} \geqq 3$ mm.

9. A noise filter according to claim 8, wherein each of the plurality of transmission lines has one of a substantially arc-shaped configuration and a substantially U-shaped configuration so as to have a coil shape in a thickness direction thereof.

10. A noise filter according to claim 8, wherein the plurality of transmission lines have a meandering-zigzag configuration.

11. A noise filter according to claim 7, wherein the at least two magnetic sheets are made of a ceramic material having a magnetic property.

12. A noise filter according to claim 7, wherein the plurality of magnetic sheets are made of a resin material including magnetic powder.

13. A noise filter according to claim 7, wherein the plurality of magnetic sheets have a substantially quadrangular shape, signal electrodes are disposed on two end surfaces of the plurality of magnetic sheets so as to be connected to two ends of the plurality of transmission lines, and a plurality of ground electrodes are disposed in approximately central positions in a longitudinal direction of the plurality of magnetic sheets so as to be connected to the plurality of ground conductors.

14. A noise filter according to claim 8, wherein a thickness of each of the pluarality of groung conductors is less than that of each of the plurality of transmission lines.

15. A noise filter comprising:
   a plurality of magnetic sheets overlapping each other;
   a plurality of transmission lines; and
   a plurality of ground conductors, the plurality of transmission lines and the plurality of ground conductors being alternately overlapped and interposed between respective ones of the plurality of magnetic sheets, with the uppermost layer and the lowermost layer of the plurality of magnetic sheets having ground conductors arranged thereon; wherein
   first ends of the plurality of transmission lines are connected to different signal input electrodes and second ends of the plurality of transmission lines are connected to different signal output electrodes; and
   a cut-off frequency is in a range of from about 200 MHz to about 2 GHz, the relative permeability μr of each of the plurality of magnetic sheets is within a range of about 4 to about 30, and a length L of each of the plurality of transmission lines is set so as to satisfy the following expression: $L/\sqrt{(\mu r-1)} \geqq 3$ mm.

16. A noise filter according to claim 15, wherein the plurality of transmission lines have a meandering-zigzag configuration.

17. A noise filter according to claim 15, wherein the plurality of transmission lines have a spiral pattern.

18. A noise filter according to claim 15, wherein a thickness of each of the plurality of ground conductors is less than that of each of the plurality of transmission lines.

* * * * *